(12) United States Patent
Huang et al.

(10) Patent No.: US 11,189,611 B2
(45) Date of Patent: Nov. 30, 2021

(54) ELECTROSTATIC DISCHARGE PROTECTION SEMICONDUCTOR DEVICE

(71) Applicant: UNITED MICROELECTRONICS CORP., Hsin-Chu (TW)

(72) Inventors: Chung-Yu Huang, Tainan (TW); Kuan-Cheng Su, Taipei (TW); Tien-Hao Tang, Hsinchu (TW); Ping-Jui Chen, Pingtung County (TW); Po-Ya Lai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 43 days.

(21) Appl. No.: 16/844,986

(22) Filed: Apr. 9, 2020

(65) Prior Publication Data

US 2020/0235088 A1     Jul. 23, 2020

Related U.S. Application Data

(62) Division of application No. 16/124,171, filed on Sep. 6, 2018, now Pat. No. 10,672,759, which is a division
(Continued)

(30) Foreign Application Priority Data

Sep. 22, 2015   (TW) ................................ 10413123.4

(51) Int. Cl.
*H01L 27/02*     (2006.01)
*H01L 27/088*     (2006.01)
(Continued)

(52) U.S. Cl.
CPC ...... *H01L 27/0277* (2013.01); *H01L 27/0259* (2013.01); *H01L 27/0886* (2013.01);
(Continued)

(58) Field of Classification Search
CPC ............ H01L 27/0259; H01L 27/0277; H01L 27/0886; H01L 29/0619; H01L 29/0649;
(Continued)

(56) References Cited

U.S. PATENT DOCUMENTS 4,315,781 A    2/1982   Henderson
6,072,219 A    6/2000   Ker
(Continued)

FOREIGN PATENT DOCUMENTS

TW            201334183 A1     8/2013

OTHER PUBLICATIONS

Huang, the specification, including the claims, and drawings in the U.S. Appl. No. 14/724,825, filed May 29, 2015.

*Primary Examiner* — Mohammed Shamsuzzaman
(74) *Attorney, Agent, or Firm* — Winston Hsu

(57) ABSTRACT

An ESD protection semiconductor device includes a substrate. A gate set disposed on the substrate. A plurality of source fins and a plurality of drain fins having a first conductivity type are disposed in the substrate respectively at two sides of the gate set. A first doped fin is disposed in the substrate and positioned in between the source fins and spaced apart from the source fins. The first doped fin comprises a second conductivity type that is complementary to the first conductivity type. A second doped fin is formed in one of the drain fins and isolated from the one of the drain fins by an isolation structure. The second doped fin is electrically connected to the first doped fin.

9 Claims, 11 Drawing Sheets

Related U.S. Application Data of application No. 15/464,362, filed on Mar. 21, 2017, now Pat. No. 10,103,136, which is a division of application No. 14/924,708, filed on Oct. 27, 2015, now Pat. No. 9,640,524.

(51) Int. Cl.

| | | |
|---|---|---|
| *H01L 29/78* | (2006.01) | |
| *H01L 29/06* | (2006.01) | |
| *H01L 29/08* | (2006.01) | |
| *H01L 29/423* | (2006.01) | |
| *H01L 29/10* | (2006.01) | |

(52) U.S. Cl.
CPC ...... *H01L 29/0619* (2013.01); *H01L 29/0649* (2013.01); *H01L 29/0847* (2013.01); *H01L 29/42372* (2013.01); *H01L 29/7816* (2013.01); *H01L 29/7835* (2013.01); *H01L 29/7851* (2013.01); *H01L 29/0653* (2013.01); *H01L 29/1045* (2013.01)

(58) Field of Classification Search
CPC .......... H01L 29/0653; H01L 29/0847; H01L 29/1045; H01L 29/42372; H01L 29/7816; H01L 29/7835; H01L 29/7851
See application file for complete search history.

(56) References Cited

U.S. PATENT DOCUMENTS

| | | | |
|---|---|---|---|
| 6,566,715 | B1 | 5/2003 | Ker |
| 7,176,539 | B2 | 2/2007 | Chen |
| 7,675,724 | B2 | 3/2010 | Ker et al. |
| 8,952,457 | B2 | 2/2015 | Wang |
| 9,653,450 | B2 * | 5/2017 | Huang ................. H01L 27/027 |
| 2002/0050615 | A1 | 5/2002 | Ker |
| 2004/0031998 | A1 | 2/2004 | Chen |
| 2004/0051146 | A1 | 3/2004 | Ker |
| 2004/0070900 | A1 | 4/2004 | Ker |
| 2005/0242399 | A1 | 11/2005 | Huang |
| 2013/0193526 | A1 * | 8/2013 | Lo ......................... H01L 29/423 257/401 |
| 2014/0097465 | A1 * | 4/2014 | Shrivastava ........ H01L 27/0817 257/133 |
| 2014/0183641 | A1 * | 7/2014 | Fan ................. H01L 21/823814 257/365 |
| 2016/0260700 | A1 | 9/2016 | Huang |
| 2017/0110446 | A1 * | 4/2017 | Huang ................. H01L 27/027 |
| 2017/0221876 | A1 * | 8/2017 | Huang ............... H01L 29/0649 |

* cited by examiner

ELECTROSTATIC DISCHARGE PROTECTION SEMICONDUCTOR DEVICE

CROSS REFERENCE TO RELATED APPLICATIONS

This application is a division of U.S. application Ser. No. 16/124,171 filed on Sep. 6, 2018, which is a division of U.S. application Ser. No. 15/464,362 filed on Mar. 21, 2017, which is a division of U.S. application Ser. No. 14/924,708 filed on Oct. 27, 2015. All benefits of the above-mentioned applications are hereby claimed for this division application.

BACKGROUND OF THE INVENTION

1. Field of the Invention

The invention relates to an electrostatic discharge (hereinafter abbreviated as ESD) protection semiconductor device, and more particularly, to an ESD protection semiconductor device with self-triggered structure.

2. Description of the Prior Art

With the advancement of technology, the development of semiconductor process is ongoing. A modern chip is therefore allowed to have a plurality of various electronic circuits configured within. For example, the integrated circuits (ICs) integrated in the chip(s) can be divided into core circuits and input/output (hereinafter abbreviated as I/O) circuits, and the core circuits and the I/O circuits are respectively driven by different power supply sources with different voltages. And for receiving the externally provided power, pads for core circuits and I/O circuits are required.

However, it is found that electrostatic charges are easily transferred to the inner circuits in the chip by those pads during processes such as manufacturing, testing, packaging, and delivering, etc. The electrostatic charges impact and damage the inner circuits in the chip, and this unwanted condition is named electrostatic discharge (ESD). As products based on ICs become more delicate, they also become more vulnerable to the impacts from external environment. And thus, it is assumed that ESD is a constant threat to the modern electronics. Models related to ESD tolerance are divided into human body model (HBM) and machine model (MM). For commercial IC products, the general ESD specification is required that IC products must pass these tests, for example, HBM ESD tolerance greater than 2 kV. As a countermeasure against to the ESD issue, there have been proposed ESD protection circuits/devices. Typically, during a normal IC operation, the ESD protection device is turned off. However when an ESD event occurs, the ESD protection device must be quickly triggered, so that the ESD current is bypassed from the inner circuit. There is therefore a continuing need in the semiconductor processing art to develop an ESD protection device having lower trigger voltage which can be quickly turned on in order to render immediate protection to the inner circuit. That is, lower threshold voltage (Vt) for the ESD protection device is required. In the meantime, demand for improving device robustness is increased.

SUMMARY OF THE INVENTION

According to the claimed invention, an ESD protection semiconductor device is provided. The ESD protection semiconductor device includes a substrate, a gate set positioned on the substrate, a source region and a drain region formed in the substrate respectively at two sides of the gate set, at least a first doped region formed in the source region, and at least a second doped region formed in the drain region. The source region, the drain region and the second doped region include a first conductivity type while the first doped region includes a second conductivity type, and the first conductivity type and the second conductivity type are complementary to each other. Furthermore, the second doped region is electrically connected to the first doped region.

According to the claimed invention, another ESD protection semiconductor device is provided. The ESD protection semiconductor device includes a substrate, a gate set positioned on the substrate, a plurality of source fins and a plurality of drain fins positioned on the substrate respectively at two sides of the gate set, at least a first doped fin positioned on the substrate and parallel with and spaced apart from the source fins, and at least a second doped fin positioned on the substrate and parallel with and spaced apart from the drain fins. The source fins and the drain fins include a first conductivity type while the first doped fin and the second doped fin include a second conductivity type, and the first conductivity type and the second conductivity type are complementary to each other. Furthermore, the first doped fin and the second doped fin are electrically connected to each other.

According to the ESD protection semiconductor device provided by the present invention, the first doped region formed in the source region and the second doped region formed in the drain region construct a self-triggered structure, therefore the threshold voltage of the ESD protection semiconductor device is reduced while the turn-on speed and the device robustness of the ESD protection semiconductor device are improved. Furthermore, the ESD protection semiconductor device provided by the present invention includes the gate set, and the gate set can include single gate, multi gate, or multi gate group. Therefore, the ESD protection semiconductor device provided by the present invention is able to be integrated into single-gate metal-oxide-semiconductor (hereinafter abbreviated as MOS) transistor device, cascode transistor device, multi-gate MOS transistor, and fin field effect transistor (hereinafter abbreviated as FinFET). Additionally, by forming well regions of different conductivity types in the substrate, the ESD protection semiconductor device provided by the present invention is able to be integrated with lateral-diffusion metal-oxide-semiconductor (hereinafter abbreviated as LDMOS) transistor approach. In other words, the ESD protection semiconductor device provided by the present invention is able to be integrated with various transistor approaches, thus product flexibility and functionality of the ESD protection semiconductor device are both improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
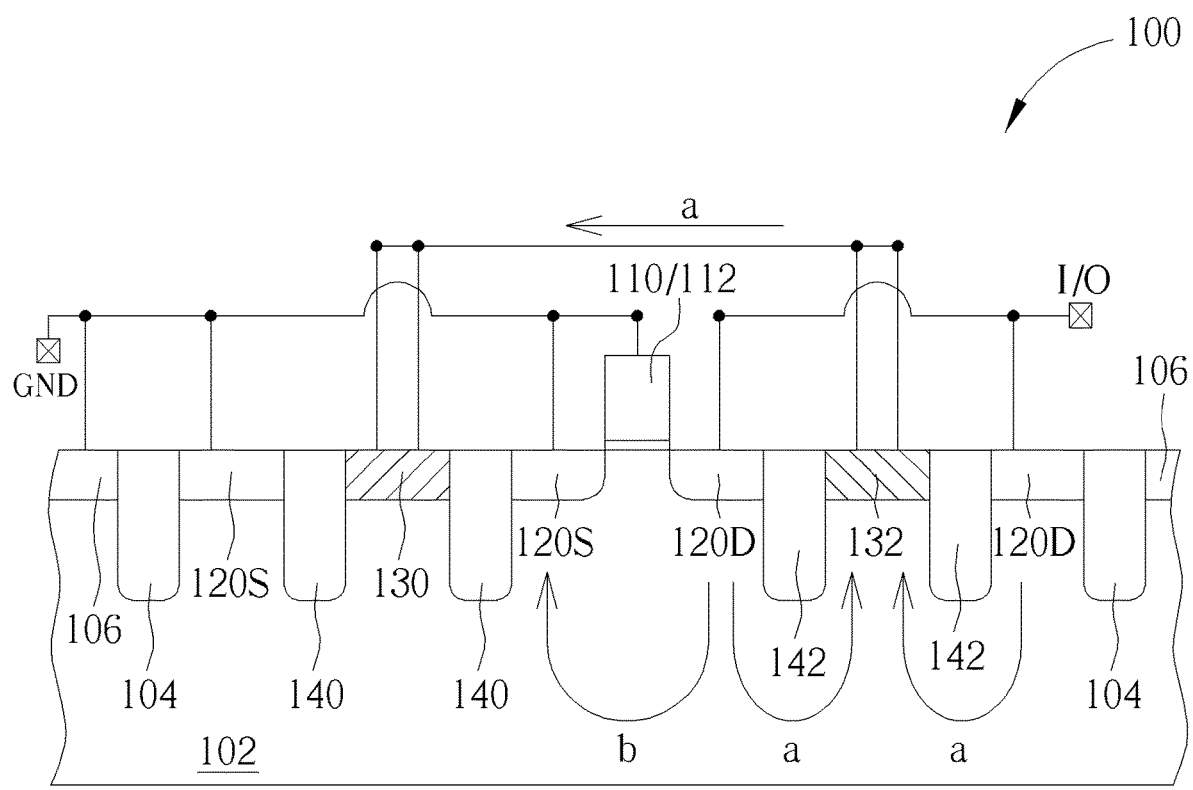
FIG. 1A is a schematic drawing illustrating an ESD protection semiconductor device provided by a first preferred embodiment of the present invention.
Figure 1B:
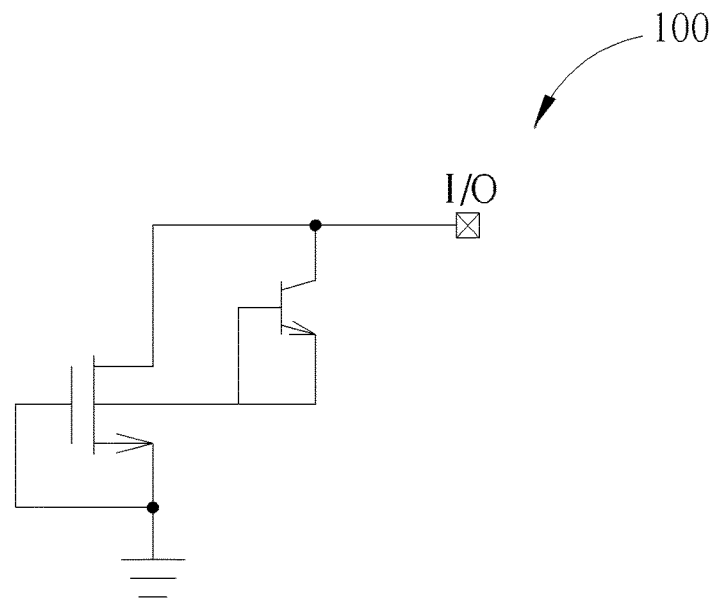
FIG. 1B is a circuit diagram of the ESD protection semiconductor device provided by the first preferred embodiment.

Please refer to FIGS. 1A-1B, wherein FIG. 1A is a schematic drawing illustrating an ESD protection semiconductor device provided by a first preferred embodiment of the present invention, and FIG. 1B is a circuit diagram of the ESD protection semiconductor device provided by the first preferred embodiment. As shown in FIG. 1A and FIG. 1B, the ESD protection semiconductor device 100 provided by the preferred embodiment includes a substrate, and the substrate includes a well region 102. A gate set 110 is positioned on the substrate and the well region 102. In the preferred embodiment, the gate set 110 includes a single gate structure 112. It is well-known to those skilled in the art that the single gate structure 112 includes a gate conductive layer and a gate dielectric layer, and since materials for the gate conductive layer and the gate dielectric layer are well-known to those skilled in the art, those details are omitted in the interest of brevity. According to the preferred embodiment, the ESD protection semiconductor device 100 further includes a source region 120S and a drain region 120D formed in the substrate/the well region 102 respectively at two sides of the gate set 110 (that is the single gate structure 112). The source region 120S and the drain region 120D include a first conductivity type while the well region 102 includes a second conductivity type, and the first conductivity type and the second conductivity type are complementary to each other. For example, the first conductivity type is an n type and the second conductivity type is a p type in the preferred embodiment. However, it should be easily realized to those skilled in the art that the first conductivity type can be the p type and the second conductivity type can be the n type. Accordingly, the preferred embodiment provides an n-source region 120S and an n-drain region 120D formed in a p-well region 102. Furthermore, the ESD protection semiconductor device 100 includes an isolation structure 104 and a guard ring 106 including the second conductivity type. The isolation structure 104 and the guard ring 106 surround the ESD protection semiconductor device 100 and electrically isolate the ESD protection semiconductor device 100 from other device. In the preferred embodiment, the isolation structure 104 preferably includes a shallow trench isolation (hereinafter abbreviated as STI) structure, but not limited to this.

Please still refer to FIG. 1A and FIG. 1B. The ESD protection semiconductor device 100 provided by the preferred embodiment further includes at least a first doped region 130 formed in the source region 120S and at least a second doped region 132 formed the drain region 120D. As shown in FIG. 1A, the first doped region 130 is positioned in a center of the source region 120S and the second doped region 132 is positioned in a center of the drain region 120D, but not limited to this. The modifications to the arrangement of the first doped region 130 and the source region 120S and to the arrangement of the second doped region 132 and the drain region 120D are exemplarily shown in FIGS. 3-4 and will be detailed thereafter. It is noteworthy that though the first doped region 130 is formed in the source region 120S, the first doped region 130 is physically spaced apart from the source region 120S by a first blocking structure 140. In the same concept, though the second doped region 132 is formed in the drain region 120D, the second doped region 132 is physically spaced apart from the drain region 120D by a second blocking structure 142. As shown in FIG. 1A, the first blocking structure 140 surrounds the first doped region 130 and therefore isolates the first doped region 130 from the source region 120S. Also as shown in FIG. 1A, the second blocking structure 142 surrounds the second doped region 132 and therefore isolates the second doped region 132 from the drain region 120D. In the preferred embodiment, the first blocking structure 140 and the second blocking structure 142 respectively include a STI structure. However, the first blocking structure 140 and the second blocking structure 142 can include dummy gate or salicide block (hereinafter abbreviated as SAB). More important, the first blocking structure 140 and the second blocking structure 142 can be a mixed type blocking structure and the details about the mixed type first blocking structure 140 and the mixed type second blocking structure 142 are exemplarily shown in FIG. 5 and will be detailed thereafter. It is noteworthy that the first doped region 130 includes the second conductivity type and the second doped region 132 includes the first conductivity type. That is, the preferred embodiment provides a p-typed first doped region 130 and an n-typed second doped region 132.

More important, the first doped region 130 formed in the source region 120S and the second doped region 132 formed in the drain region 120D are electrically connected to each other as shown in FIG. 1A. Furthermore, the gate set 110 (that is the single gate structure 112), the source region 120S and the guard ring 106 are electrically connected to a ground potential GND, and the drain region 120D is electrically connected to an input/output pad I/O. As shown in FIG. 1A and FIG. 1B, when an ESD event occurs, the ESD surges will be diverted to the ground by the gate set 110/112, which is electrically connected to the ground potential GND. More important, the n-drain region 120D, the p-well region 102 and the n-typed second doped region 132 construct an npn bipolar junction transistor (hereinafter abbreviated as BJT), and this npn-BJT is self-triggered during the ESD event. Consequently, the ESD current is bypassed from the drain region 120D to the second doped region 132 and then to the first doped region 130, which is electrically connected to the second doped region 132, as arrows "a" depicted. Moreover, the n-drain region 120D, the p-well region 102 and the n-source region 120S construct another npn-BJT. This npn-BJT is also self-triggered during the ESD events, and thus the ESD current is bypassed from the drain region 120D to the source region 120S, which is electrically connected to the ground potential GND, as arrow "b" depicted. Briefly speaking, the preferred embodiment provides plural self-triggered BJTs for bypassing the ESD currents.

Accordingly, the ESD protection semiconductor device 100 provided by the preferred embodiment is a single-gate MOS transistor device including self-triggered BJTs. Consequently, the ESD currents can be bypassed by the self-triggered BJTs and thus the threshold voltage of the ESD protection semiconductor device 100 is efficaciously reduced and the turn-on speed is improved. Since the self-triggered BJTs serve as the bypass for ESD, damage caused by the ESD event is avoided and thus device robustness of the ESD protection semiconductor device 100 is improved. More important, since the bypasses are self-triggered structures, no leakage is found when the ESD protection semiconductor device 100 is turned off. Additionally, according to the preferred embodiment, formation of the first doped region 130 and the second doped region 132 can be integrated in the state-of-the-art semiconductor manufacturing process without increasing process complexity and cost.

Figure 2A:
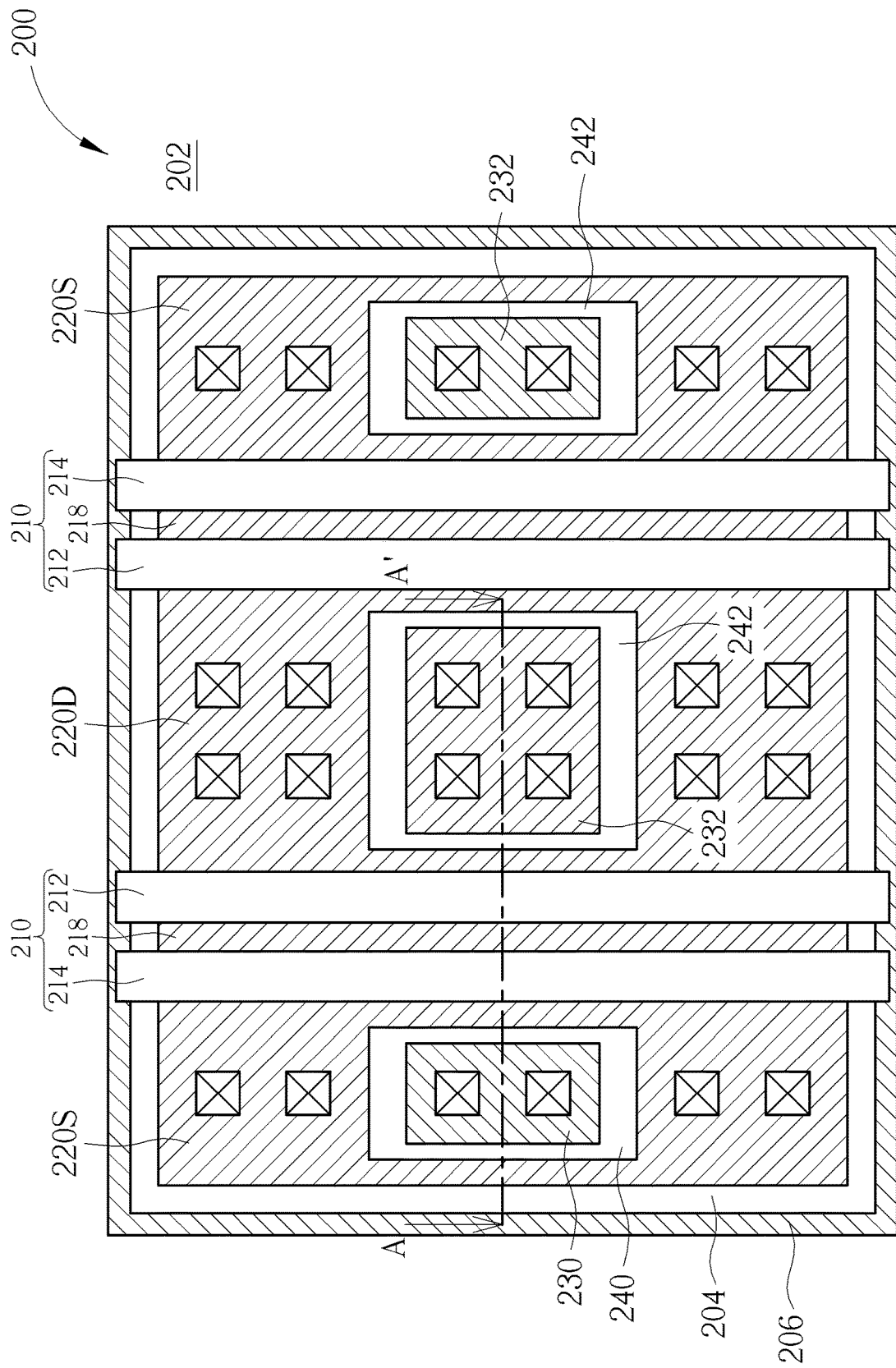
FIG. 2A is a schematic drawing illustrating a layout structure of an ESD protection semiconductor device provided by a second preferred embodiment of the present invention.
Figure 2B:
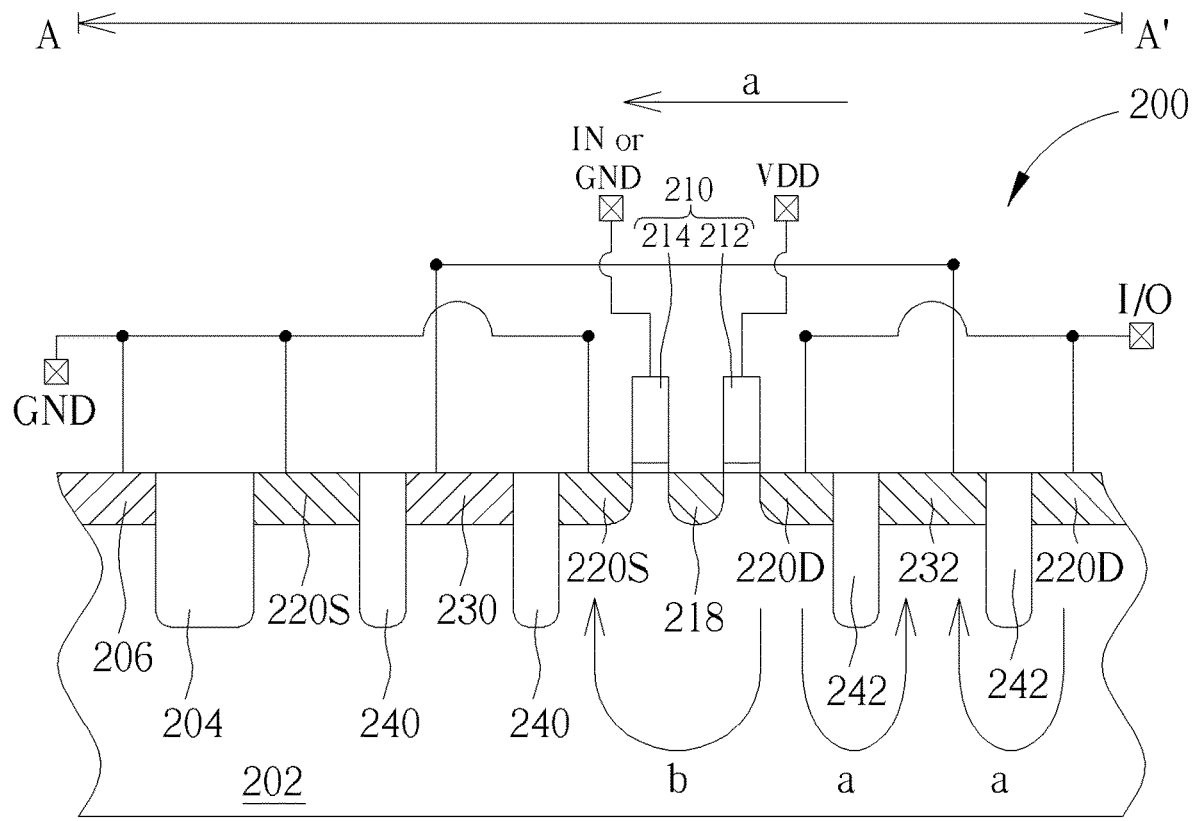
FIG. 2B is a schematic drawing illustrating the ESD protection semiconductor device provided by the second preferred embodiment and also is a cross-sectional view taken along a Line A-A' of FIG. 2A.
Figure 2C:
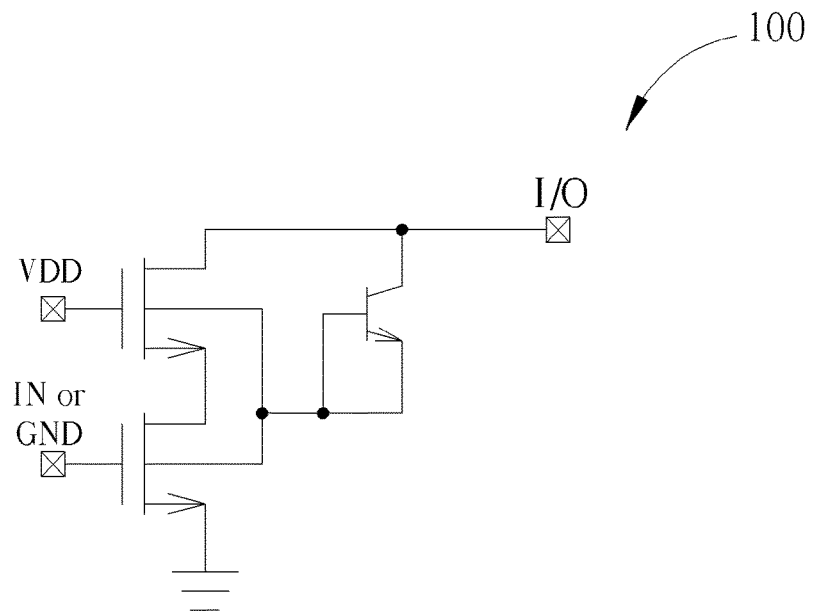
FIG. 2C is a circuit diagram of the ESD protection semiconductor device provided by the second preferred embodiment.

Please refer to FIGS. 2A-2C, wherein FIG. 2A is a schematic drawing illustrating a layout structure of an ESD protection semiconductor device provided by a second preferred embodiment of the present invention, FIG. 2B is a schematic drawing illustrating the ESD protection semiconductor device provided by the second preferred embodiment and also is a cross-sectional view taken along a Line A-A' of FIG. 2A, and FIG. 2C is a circuit diagram of the ESD protection semiconductor device provided by the second preferred embodiment. As shown in FIG. 2A and FIG. 2B, the ESD protection semiconductor device 200 provided by the preferred embodiment includes a substrate, and the substrate includes a well region 202. A gate set 210 is positioned on the substrate and the well region 202. In the preferred embodiment, the gate set 210 includes a first gate structure 212, a second gate structure 214 and a third doped region 218. As shown in FIG. 2A and FIG. 2B, the third doped region 218 is positioned in between the first gate structure 212 and the second gate structure 214. Therefore the first gate structure 212 and the second gate structure 214 are physically spaced apart from each other by the third doped region 218. However, the first gate structure 212 and the second gate structure 214 are electrically connected to each other by the third doped region 218. It is well-known to those skilled in the art that the first gate structure 212 and the second gate structure 214 respectively include a gate conductive layer and a gate dielectric layer, and since materials for the gate conductive layer and the gate dielectric layer are well-known to those skilled in the art, those details are omitted in the interest of brevity. According to the preferred embodiment, the ESD protection semiconductor device 200 further includes a source region 220S and a drain region 220D formed in the substrate/the well region 202 respectively at two sides of the gate set 210. As shown in FIG. 2A and FIG. 2B, the first gate structure 212 is positioned in between the third doped region 218 and the drain region 220D while the second gate structure 214 is positioned in between the third doped region 218 and the source region 220S. The source region 220S, the drain region 220D and the third doped region 218 include a first conductivity type while the well region 202 includes a second conductivity type, and the first conductivity type and the second conductivity type are complementary to each other. For example, the first conductivity type is an n type and the second conductivity type is a p type in the preferred embodiment. However, as mentioned above, the first conductivity type can be the p type and the second conductivity type can be the n type. Furthermore, the ESD protection semiconductor device 200 includes an isolation structure 204 and a guard ring 206 including the second conductivity type. The isolation structure 204 and the guard ring 206 surround the ESD protection semiconductor device 200 and electrically isolate the ESD protection semiconductor device 200 from other device. In the preferred embodiment, the isolation structure 204 preferably includes a STI structure, but not limited to this.

Please still refer to FIG. 2A and FIG. 2B. The ESD protection semiconductor device 200 provided by the preferred embodiment further includes at least a first doped region 230 formed in the source region 220S and at least a second doped region 232 formed in the drain region 220D. As shown in FIG. 2A, the first doped region 230 is positioned in a center of the source region 220S and the second doped region 232 is positioned in a center of the drain region 220D, but not limited to this. The modifications to the arrangement of the first doped region 230 and the source region 220S and to the arrangement of the second doped region 232 and the drain region 220D are exemplarily shown in FIGS. 3-4 and will be detailed thereafter. It is noteworthy that though the first doped region 230 is formed in the source region 220S, the first doped region 230 is spaced apart from the source region 220S by a first blocking structure 240. In the same concept, though the second doped region 232 is formed in the drain region 220D, the second doped region 232 is spaced apart from the drain region 220D by a second blocking structure 242. As shown in FIG. 2A and FIG. 2B, the first blocking structure 240 surrounds the first doped region 230 and therefore isolates the first doped region 230 from the source region 220S. Also, the second blocking structure 242 surrounds the second doped region 232 and therefore isolates the second doped region 232 from the drain region 220D. In the preferred embodiment, the first blocking structure 240 and the second blocking structure 242 respectively include a STI structure. However, the first blocking structure 240 and the second blocking structure 242 can include dummy gate or SAB. It is noteworthy that the first doped region 230 includes the second conductivity type while the second doped region 232 includes the first conductivity type. That is, the preferred embodiment provides a p-typed first doped region 230 and an n-typed second doped region 232.

More important, the first doped region 230 formed in the source region 220S and the second doped region 232 formed in the drain region 220D are electrically connected to each other as shown in FIG. 2B. Furthermore, in the gate set 210, the first gate structure 212 is electrically connected to a power supply pad (Vdd pad) VDD while the second gate structure 214 is electrically connected to a ground potential GND or a signal input pad IN. The source region 220S and the guard ring 206 are electrically connected to a ground potential GND, and the drain region 220D is electrically connected to an input/output pad I/O. As shown in FIG. 2B and FIG. 2C, when an ESD event occurs, the ESD surges will be diverted to the ground by the second gate structure 214, which is electrically connected to the ground potential GND. More important, the n-drain region 220D, the p-well region 202 and the n-typed second doped region 232 construct an npn-BJT, and this npn-BJT is self-triggered during the ESD event. Consequently, the ESD current is bypassed from the drain region 220D to the second doped region 232, and then to the first doped region 230, which is electrically connected to the second doped region 232, as arrows "a" depicted. Moreover, the n-drain region 220D, the p-well region 202 and the n-source region 220S also construct an npn-BJT. This npn-BJT is also self-triggered during the ESD events, and thus the ESD current is bypassed from the drain region 220D to the source region 220S, which is electrically connected to the ground potential GND, as arrow "b" depicted. Briefly speaking, the preferred embodiment provides plural self-triggered BJTs for bypassing the ESD currents.

Accordingly, the ESD protection semiconductor device 200 provided by the preferred embodiment is a cascade transistor device including a self-triggered BJTs. Consequently, the ESD currents can be bypassed by the self-triggered BJTs, and thus the threshold voltage of the ESD protection semiconductor device 200 is efficaciously reduced and the turn-on speed is improved. Since the self-triggered BJTs serve as the bypass for ESD, damage caused by ESD event is avoided and thus device robustness of the ESD protection semiconductor device 200 is improved. Accordingly, the ESD pulse voltage of the ESD protection semiconductor device 200 in human body mode (HBM) is increased from 1.4 kV to 2 kV. That is, tolerance of the ESD protection semiconductor device 200 is improved at least 43%. More important, since the bypasses are self-triggered BJTs, no leakage is found when the ESD protection semiconductor device 200 is turned off. Additionally, according to the preferred embodiment, formation of the first doped region 230 and the second doped region 232 can be integrated in the state-of-the-art semiconductor manufacturing process without increasing process complexity and cost.

Figure 3:
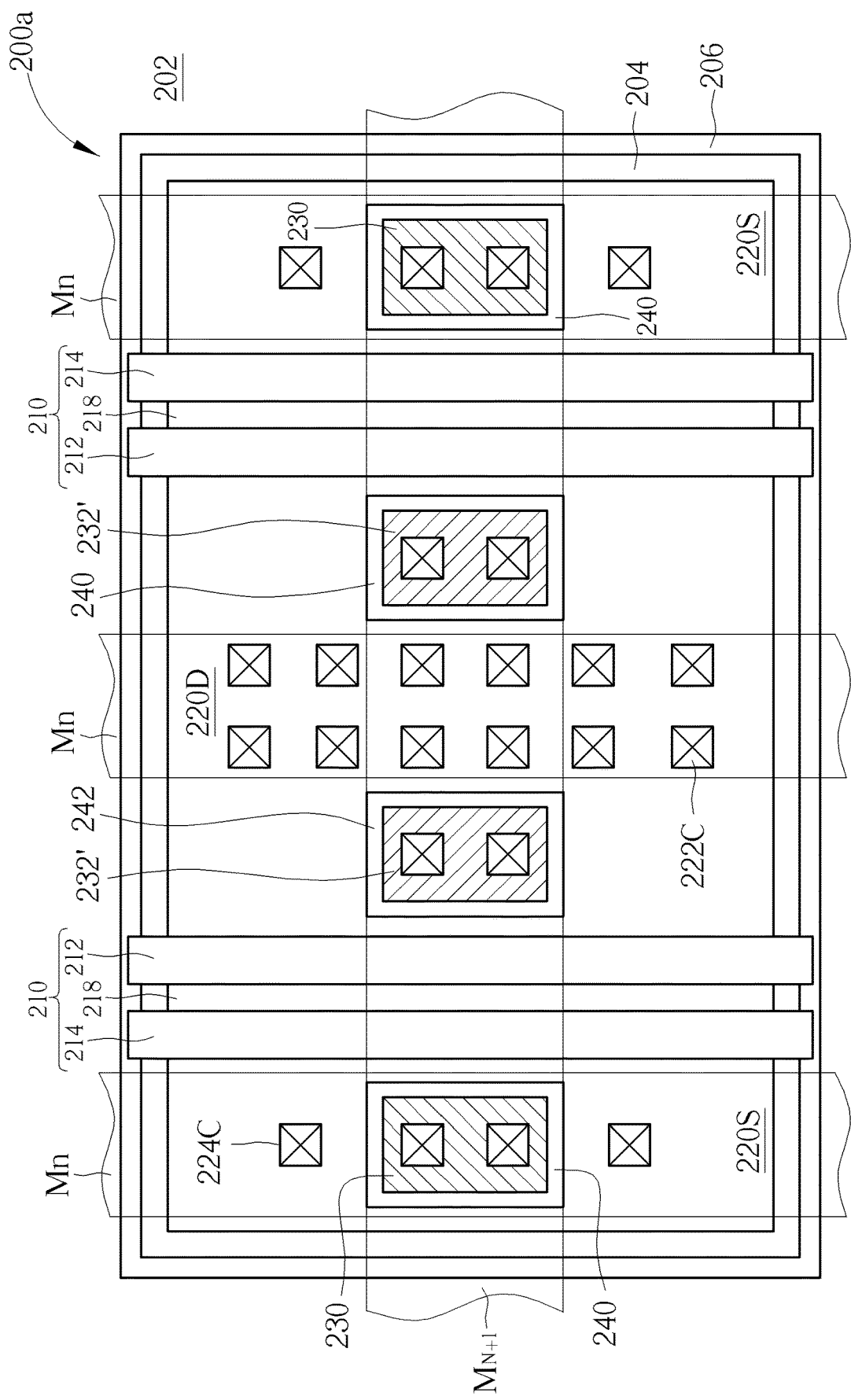
FIG. 3 is a schematic drawing illustrating a layout structure of an ESD protection semiconductor device provided by a modification to the present invention.

Please refer to FIG. 3, which is a schematic drawing illustrating a layout structure of an ESD protection semiconductor device provided by a modification to the present invention. It should be noted that elements the same in the present modification and the second preferred embodiment are designated by the same numerals and include the same material choice and electrical relationships, therefore those details are omitted for simplicity. More important, the present modification is provided not only for the second preferred embodiment, but also for the first preferred embodiment and the following provided preferred embodiments. As shown in FIG. 3, the difference between the modification and the preferred embodiments is detailed: In the aforementioned ESD protection semiconductor device(s), the first doped region is formed in the center of the source region and the second doped region is formed in the center of the drain region. However, in the ESD protection semiconductor device 200a provided by the present modification, the second doped region further includes a pair of sub-second doped regions 232'. The sub-second doped regions 232' are respectively positioned in between drain contact plugs 222C and the gate set 210.

According to the modification, since the sub-second doped regions 232' are positioned in between the drain contact plugs 222C and the gate set 210, no drain contact plugs 222C are placed at top and bottom sides of the sub-second doped regions 232', as shown in FIG. 3. Therefore, electrical connections for the source contact plugs 224C and for the drain contact plugs 222C can be respectively constructed by meta layers Mn while the electrical connections for the first doped region 230 and for the sub-second doped regions 232' can be constructed by another metal layer Mn+1. As shown in FIG. 3, no more bridge is required when constructing the electrical connection for the sub-second doped regions 232' and the first doped region 230. And thus, product design and process design are both simplified.

Figure 4:
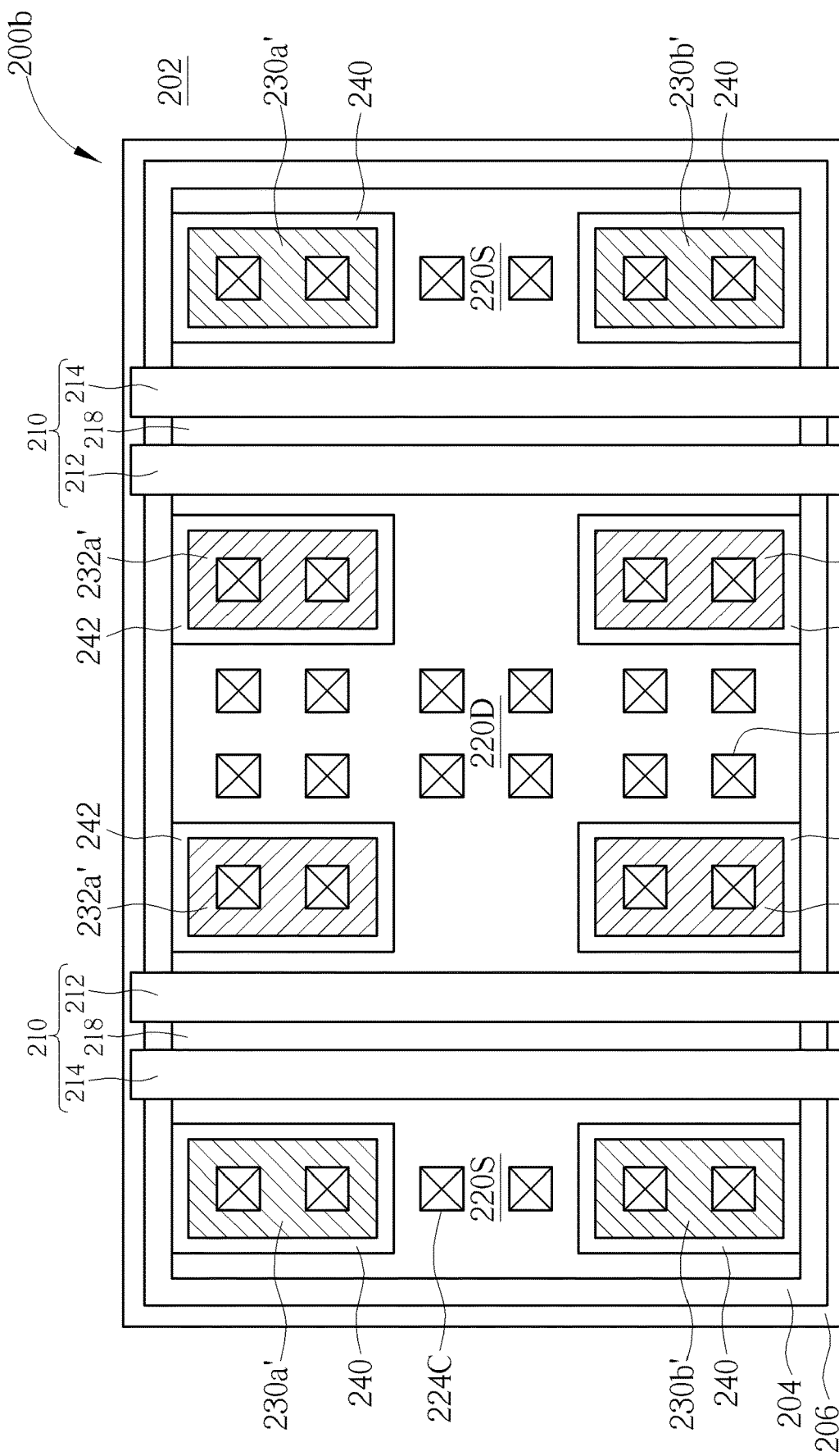
FIG. 4 is a schematic drawing illustrating a layout structure of an ESD protection semiconductor device provided by another modification to the present invention.

Please refer to FIG. 4, which is a schematic drawing illustrating a layout structure of an ESD protection semiconductor device provided by another modification to the present invention. It should be noted that elements the same in the present modification and the second preferred embodiment are designated by the same numerals and include the same material choice and electrical relationships, therefore those details are omitted for simplicity. More important, the present modification is provided not only for the second preferred embodiment, but also for the first preferred embodiment and the following provided preferred embodiments. The difference between the modification and the preferred embodiments is detailed: In the aforementioned ESD protection semiconductor device(s), the first doped region includes an islanding pattern formed in the center of the source region and the second doped region includes an islanding pattern formed in the center of the drain region. However, in the ESD protection semiconductor device 200b provided by the modification, the first doped region further includes a pair of sub-first doped regions 230a'/230b', and the sub-first doped regions 230a'/230b' are respectively positioned at two opposite ends of the source region 220S, as shown in FIG. 4. In the same concept, the second doped region further includes a plurality of pairs of sub-second doped regions 232a'/232b', and the sub-second doped regions 232a'/232b' are respectively positioned at two opposite ends of the drain region 220D. More important, the sub-second doped regions 232a'/232b' are respectively positioned in between the drain contact plugs 222C and the gate set 210, as shown in FIG. 3.

In the present modification, an amount of the second doped region 232a'/232b', which are used to construct the self-triggered structure, is increased. Consequently, an amount of the self-triggered structures is increased and thus more bypasses are obtained. Therefore the ESD protection semiconductor device 200b is further improved. Furthermore, since the sub-second doped regions 232a'/232b' are positioned in between the drain contact plugs 222C and the gate set 210, no drain contact plugs 222C are placed at top and bottom sides of the sub-second doped regions 232a'/

232b', as shown in FIG. 4. In the same concept, no source contact plugs 224C are placed at top and bottom ends of the sub-first doped regions 230a'/230b', as shown in FIG. 4. Therefore, no more bridge is required when constructing the electrical connection for the sub-first doped regions 230a'/ 230b' and the sub-second doped regions 232a'/232b'. And thus, product design and process design are both simplified.

Figure 5:
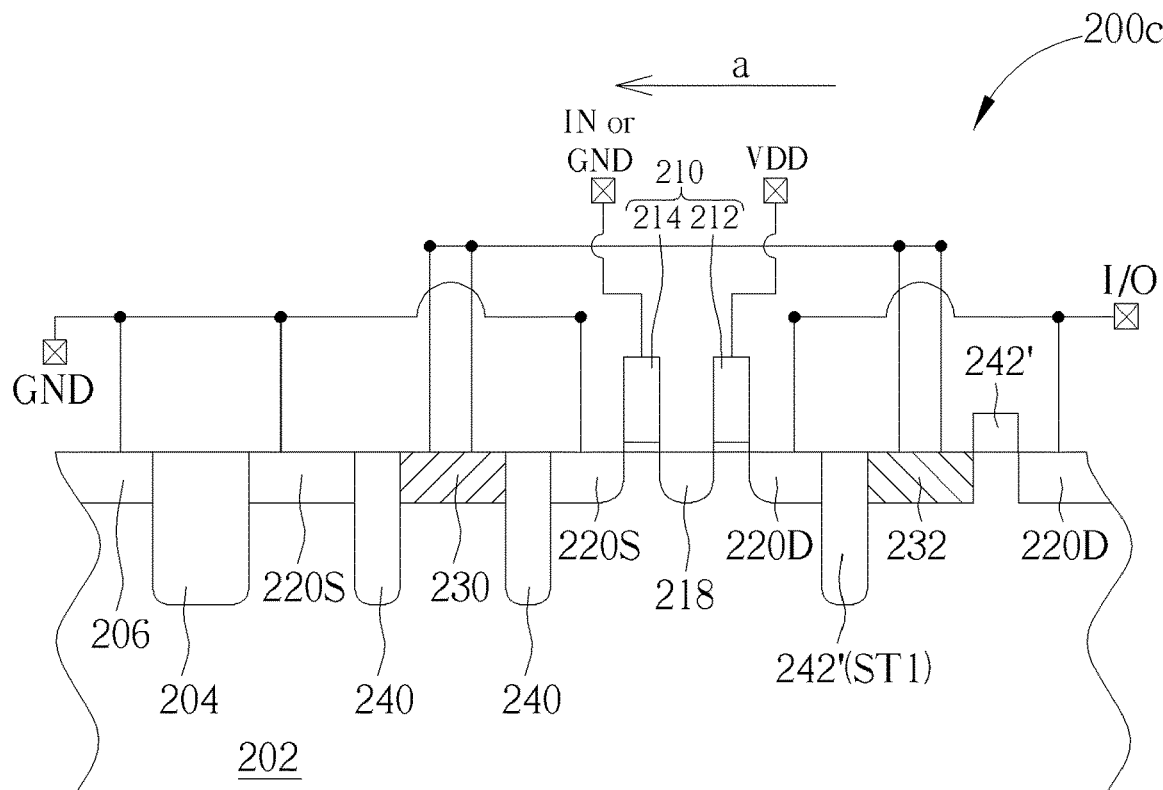
FIG. 5 is a schematic drawing illustrating an ESD protection semiconductor device provided by still another modification to the present invention.

Please refer to FIG. 5, which is a schematic drawing illustrating an ESD protection semiconductor device provided by still another modification to the present invention. It should be noted that elements the same in the present modification and the second preferred embodiment are designated by the same numerals and include the same material choice and electrical relationships, therefore those details are omitted for simplicity. More important, the present modification is provided not only for the second preferred embodiment, but also for the first preferred embodiment and the following provided preferred embodiments. The difference between the modification and the preferred embodiments is detailed: According to the ESD protection semiconductor device 200c provided by the modification, the second blocking structure includes a mixed type blocking structure 242'. Specifically, the mixed type blocking structure 242' can include a STI-dummy gate mixed blocking structure or a STI-SAB mixed blocking structure. It should be noted that in the modification, the mixed type blocking structure 242' preferably includes the STI at the side near the gate set 210 such that electrical isolation is ensured. According to the modification, the dummy gate or the SAB can serve as implant mask and thus no doped region is formed under the dummy gate or the SAB. Therefore, as shown in FIG. 5, the second doped region 232 is isolated from the drain region 220D by the mixed type blocking structure 242' and the substrate 202 formed underneath.

Figure 6:
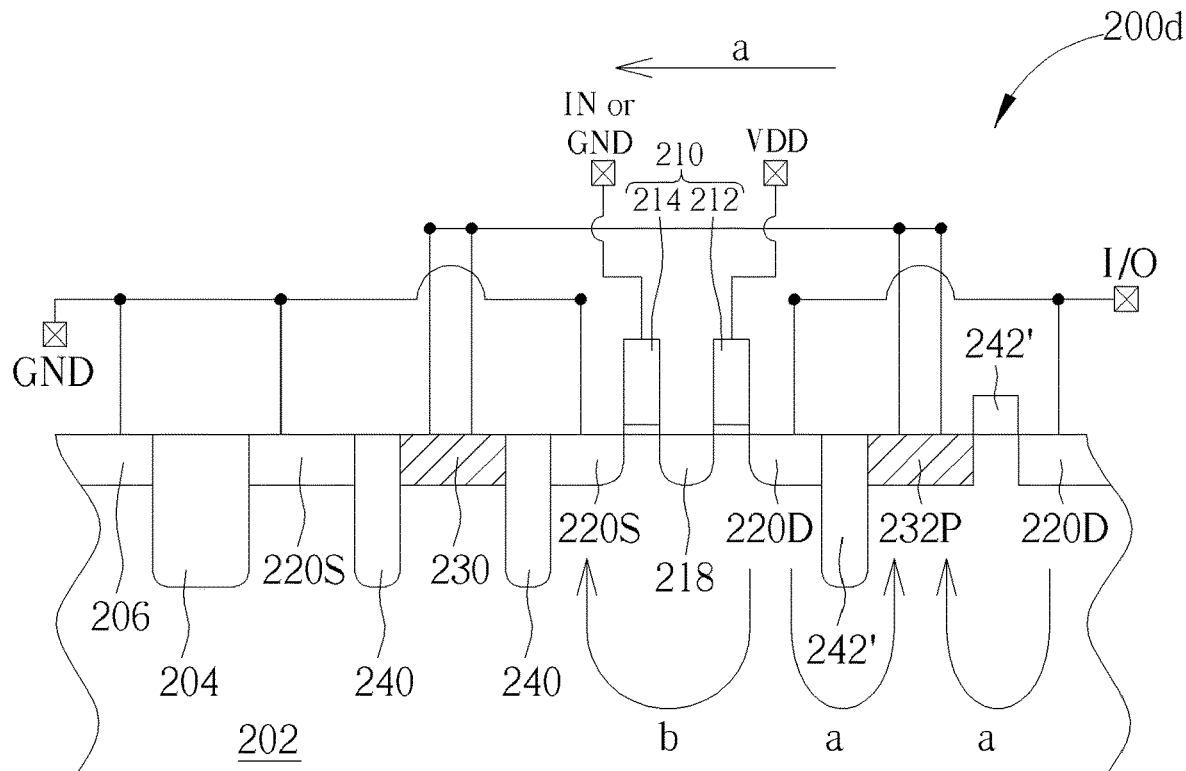
FIG. 6 is a schematic drawing illustrating an ESD protection semiconductor device provided by still another modification to the present invention.

Please refer to FIG. 6, which is a schematic drawing illustrating an ESD protection semiconductor device provided by still another modification to the present invention. It should be noted that elements the same in the present modification and the second preferred embodiment are designated by the same numerals and include the same material choice and electrical relationships, therefore those details are omitted for simplicity. More important, the present modification is provided not only for the second preferred embodiment, but also for the first preferred embodiment and the following provided preferred embodiments. The difference between the modification and the preferred embodiments is detailed: According to the ESD protection semiconductor device 200d provided by the modification, the second blocking structure includes the mixed type blocking structure 242', and the mixed type blocking structure 242' can include a STI-dummy gate mixed blocking structure or a STI-SAB mixed blocking structure. It should be noted that in the present modification, the mixed type blocking structure 242' preferably includes the STI at the side near the gate set 210 such that electrical isolation is ensured. More important, the second doped region 232 which includes the first conductivity type in the abovementioned preferred embodiments is replaced with a second doped region 232p including the second conductivity type.

Accordingly, when an ESD event occurs, the ESD surges will be diverted to the ground by the second gate structure 214, which is electrically connected to the ground pad GND. More important, the n-drain region 220D, the p-well region 202 and the p-typed second doped region 232p construct a diode, and this diode is self-triggered during the ESD event. Consequently, the ESD current is bypassed from the drain region 220D to the second doped region 232p and then to the first doped region 230, which is electrically connected to the second doped region 232p, as arrows "a" depicted. As mentioned above, the n-drain region 220D, the p-well region 202 and the n-source region 220S construct an npn-BJT. This npn-BJT is also self-triggered during the ESD events, and thus the ESD current is bypassed from the drain region 220D to the source region 220S, which is electrically connected to the ground potential GND, as arrow "b" depicted. Briefly speaking, the preferred embodiment provides the self-triggered structures (including the diode and the BJT) for bypassing the ESD currents.

Figure 7:
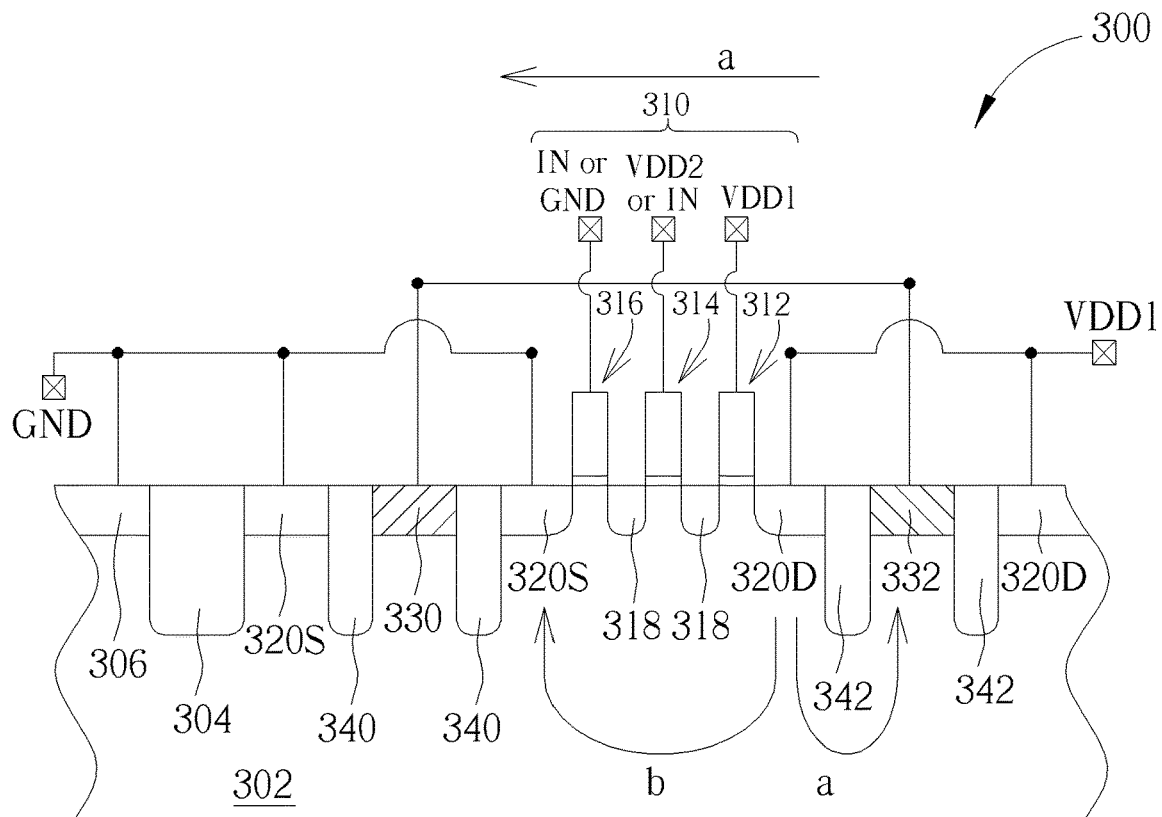
FIG. 7 is a schematic drawing illustrating an ESD protection semiconductor device provided by a third preferred embodiment of the present invention.

Please refer to FIG. 7, which is a schematic drawing illustrating an ESD protection semiconductor device provided by a third preferred embodiment of the present invention. As shown in FIG. 7, the ESD protection semiconductor device 300 provided by the preferred embodiment includes a substrate, and the substrate includes a well region 302. A gate set 310 is positioned on the substrate and the well region 302. In the preferred embodiment, the gate set 310 includes a first gate structure 312, a second gate structure 314, a third doped region 316, and two third doped regions 318. As shown in FIG. 7, the third doped regions 318 are respectively positioned in between the first gate structure 312 and the second gate structure 314, and in between the second gate structure 314 and the third gate structure 316. Therefore the first gate structure 312, the second gate structure 314 and the third gate structure 316 are all physically spaced apart from each other by the third doped regions 318. However, the first gate structure 312, the second gate structure 314 and the third gate structure 316 are all electrically connected to each other by the third doped regions 318. It is well-known to those skilled in the art that the first gate structure 312, the second gate structure 314 and the third gate structure 318 respectively include a gate conductive layer and a gate dielectric layer, and since materials for the gate conductive layer and the gate dielectric layer are well-known to those skilled in the art, those details are omitted in the interest of brevity. According to the preferred embodiment, the ESD protection semiconductor device 300 further includes a source region 320S and a drain region 320D formed in the substrate/the well region 302 respectively at two sides of the gate set 310. As shown in FIG. 7, the first gate structure 312, the second gate structure 314 and the third gate structure 316 on the substrate/the well region 302 are arranged in a direction from the drain region 320D to the source region 320S. The source region 320S, the drain region 320D and the third doped regions 318 include a first conductivity type while the well region 302 includes a second conductivity type, and the first conductivity type and the second conductivity type are complementary to each other. For example, the first conductivity type is an n type and the second conductivity type is a p type in the preferred embodiment. However, as mentioned above, the first conductivity type can be the p type and the second conductivity type can be the n type. Furthermore, the ESD protection semiconductor device 300 includes an isolation structure 304 and a guard ring 306 including the second conductivity type. The isolation structure 304 and the guard ring 306 surround the ESD protection semiconductor device 300 and electrically isolate the ESD protection semiconductor device 300 from other device. In the preferred embodiment, the isolation structure 304 preferably includes a STI structure, but not limited to this.

Please still refer to FIG. 7. The ESD protection semiconductor device 300 provided by the preferred embodiment further includes at least a first doped region 330 formed in the source region 320S and at least a second doped region 332 formed in the drain region 320D. As shown in FIG. 7, the first doped region 330 is positioned in a center of the source region 320S and the second doped region 332 is positioned in a center of the drain region 320D, but not limited to this. The modifications to the arrangement of the first doped region 330 and the source region 320S and to the arrangement of the second doped region 332 and the drain region 320D are exemplarily shown in FIGS. 3-4 and have been described in the aforementioned modifications therefore those details are omitted for simplicity. It is noteworthy that though the first doped region 330 is formed in the source region 320S, the first doped region 330 is spaced apart from the source region 320S by a first blocking structure 340. In the same concept, though the second doped region 332 is formed in the drain region 320D, the second doped region 332 is spaced apart from the drain region 320D by a second blocking structure 342. As shown in FIG. 7, the first blocking structure 340 surrounds the first doped region 330 and therefore isolates the first doped region 330 from the source region 320S. Also, the second blocking structure 342 surrounds the second doped region 332 and therefore isolates the second doped region 332 from the drain region 320D. In the preferred embodiment, the first blocking structure 340 and the second blocking structure 342 respectively include a STI structure. However, the first blocking structure 340 and the second blocking structure 342 can include dummy gate, SAB, the above mentioned STI-dummy gate mixed blocking structure, or the above mentioned STI-SAB mixed blocking structure. Furthermore, the first doped region 330 includes the second conductivity type while the second doped region 332 includes the first conductivity type according to the preferred embodiment.

More important, the first doped region 330 formed in the source region 320S and the second doped region 332 formed in the drain region 320D are electrically connected to each other as shown in FIG. 7. Furthermore, the drain region 320D and the first gate structure 312 of the gate set 310 are electrically connected to a power supply pad VDD1, the second gate structure 314 of the gate set 310 is electrically connected to another power supply pad VDD2 or a signal input pad IN, and the third gate structure 316 of the gate set 310 is electrically connected to a signal input pad IN or a ground potential GND. And the source region 320S and the guard ring 306 are electrically connected to a ground potential GND. As shown in FIG. 7, when an ESD event occurs, the n-drain region 320D, the p-well region 302 and the n-typed second doped region 332 construct an npn-BJT, and this npn-BJT is self-triggered during the ESD event. Consequently, the ESD current is bypassed from the drain region 320D to the second doped region 332 and then to the first doped region 330, which is electrically connected to the second doped region 332, as arrow "a" depicted. Moreover, the n-drain region 320D, the p-well region 302 and the n-source region 320S construct another npn-BJT. This npn-BJT is also self-triggered during the ESD events, and thus the ESD current is bypassed from the drain region 320D to the source region 320S, which is electrically connected to the ground potential GND, as arrow "b" depicted. Briefly speaking, the preferred embodiment provides plural self-triggered BJTs for bypassing the ESD currents. However, it should be easily realized by those skilled in the art that the electrical relationship between the gate structures, the power supply pads, the signal input pads and the ground potential can be modified according to different requirements and thus it is not limited to this.

Accordingly, the ESD protection semiconductor device 300 provided by the preferred embodiment is a multi-gate transistor device including self-triggered BJTs, and the amount of the gate structures can be adjusted according to different voltage requirements. Consequently, the ESD currents can be bypassed by the self-triggered BJTs, and thus the threshold voltage of the ESD protection semiconductor device 300 is efficaciously reduced and the turn-on speed is improved. Since the self-triggered BJTs serve as the bypass for ESD, damage caused by ESD event is avoided and thus device robustness of the ESD protection semiconductor device 300 is improved. More important, since the bypasses are self-triggered structures, no leakage is found when the ESD protection semiconductor device 300 is turned off. Additionally, according to the preferred embodiment, formation of the first doped region 330 and the second doped region 332 can be integrated in the state-of-the-art semiconductor manufacturing process without increasing process complexity and cost.

Figure 8:
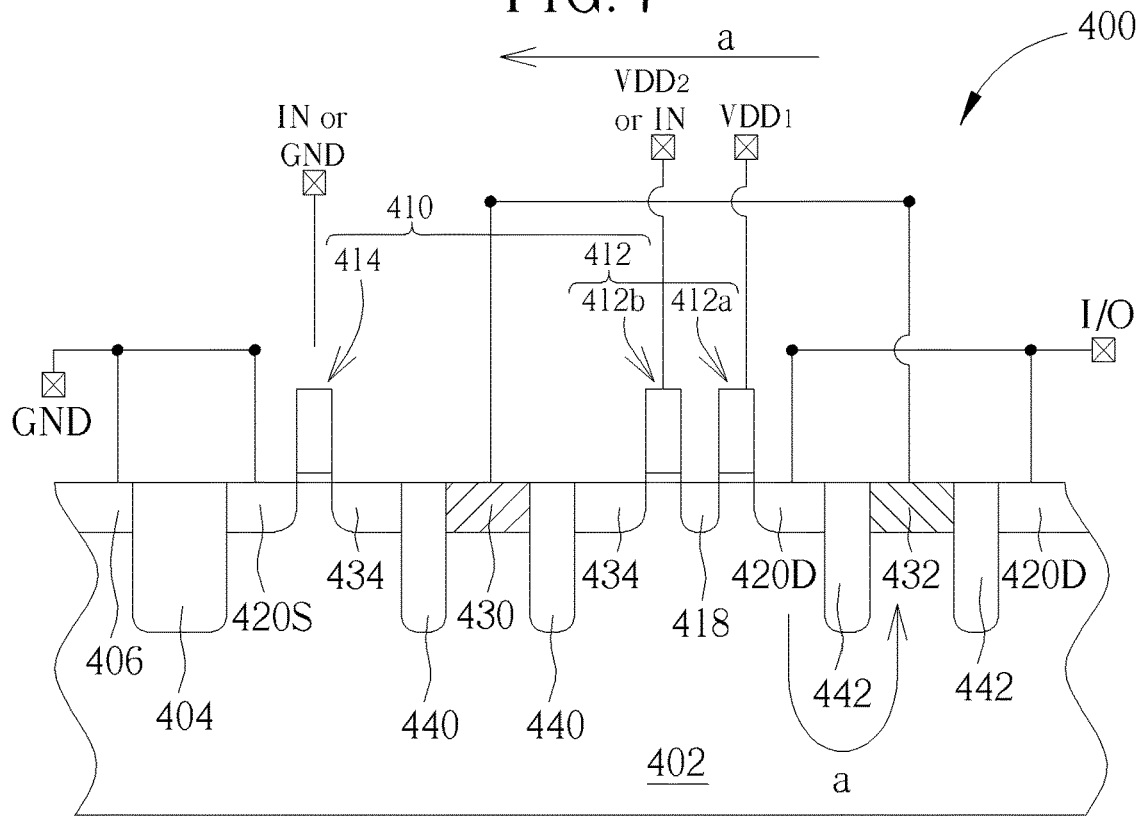
FIG. 8 is a schematic drawing illustrating an ESD protection semiconductor device provided by a fourth preferred embodiment of the present invention.

Please refer to FIG. 8, which is a schematic drawing illustrating an ESD protection semiconductor device provided by a fourth preferred embodiment of the present invention. As shown in FIG. 8, the ESD protection semiconductor device 400 provided by the preferred embodiment includes a substrate, and the substrate includes a well region 402. A gate set 410 is positioned on the substrate and the well region 402. In the preferred embodiment, the ESD protection semiconductor device 400 further includes a source region 420S and a drain region 420D formed in the substrate/the well region 402 respectively at two sides of the gate set 410. At least a second doped region 432 is formed in the drain region 420D. The source region 420S, the drain region 420D and the second doped region 432 include a first conductivity type while the substrate/the well region 402 include a second conductivity type. The first conductivity type and the second conductivity type are complementary to each other. For example, the first conductivity type is an n type and the second conductivity type is a p type in the preferred embodiment, but not limited to this. In the preferred embodiment, the gate set 410 positioned in between the drain region 420D and the source region 420S further includes a first gate group 412 and a second gate group 414. As shown in FIG. 8, the first gate group 412 and the second gate group 414 are physically spaced apart from each other by a fourth doped region 434. And a first doped region 430 is formed in the fourth doped region 434. In other words, the first gate group 412 is positioned in between the drain region 420D and the fourth doped region 434, and the second gate group 414 is positioned in between the fourth doped region 434 and the source region 420S. The first doped region 430 includes the second conductivity type and the fourth doped region 434 includes the first conductivity type. In the preferred embodiment, the first gate group 412 further includes at least a first gate structure 412a and a second gate structure 412b while the second gate group 414 includes a single gate structure 414. A third doped region 418 including the first conductivity type is formed in between the first gate structure 412a and the second gate structure 412b of the first gate group 412 so that the first gate structure 412a and the second gate structure 412b are physically spaced apart from each other by the third doped region 418. However, the first gate structure 412a and the second gate structure 412b are electrically connected to each other by the third doped region 418. Particularly speaking, the first gate structure 412a is positioned in between the third doped region 418 and the drain region 420D while the second gate structure 412b is positioned in between the third doped region 418 and the fourth doped region 434. It is well-known to those skilled in the art that the first gate structure 412a, the second gate structure 412b, and the single gate structure 414 respectively include a gate conductive layer and a gate dielectric layer, and since materials for the gate conductive layer and the gate dielectric layer are well-known to those skilled in the art, those details are omitted in the interest of brevity. Furthermore, the ESD protection semiconductor device 400 includes an isolation structure 404 and a guard ring 406 including the second conductivity type. The isolation structure 404 and the guard ring 406 surround the ESD protection semiconductor device 400 and electrically isolate the ESD protection semiconductor device 400 from other device. In the preferred embodiment, the isolation structure 404 preferably includes a STI structure, but not limited to this.

Please still refer to FIG. 8. In the ESD protection semiconductor device 400 provided by the preferred embodiment, the first doped region 430 is positioned in a center of the fourth doped region 434 and the second doped region 432 is positioned in a center of the drain region 420D, but not limited to this. The modifications to the arrangement of the first doped region 430 and the fourth doped region 434 and to the arrangement of the second doped region 432 and the drain region 420D are exemplarily shown in FIGS. 3-4 and have been described in the aforementioned modifications therefore those details are omitted for simplicity. It is noteworthy that though the first doped region 430 is formed in the fourth doped region 434, the first doped region 430 is spaced apart from the fourth doped region 434 by a first blocking structure 440. In the same concept, though the second doped region 432 is formed in the drain region 420D, the second doped region 432 is spaced apart from the drain region 420D by a second blocking structure 442. As shown in FIG. 8, the first blocking structure 440 surrounds the first doped region 430 and therefore isolates the first doped region 430 from the fourth doped region 434. Also, the second blocking structure 442 surrounds the second doped region 432 and therefore isolates the second doped region 432 from the drain region 420D. In the preferred embodiment, the first blocking structure 440 and the second blocking structure 442 respectively include a STI structure. However, the first blocking structure 440 and the second blocking structure 442 can include dummy gate, SAB, STI-dummy gate mixed blocking structure, or STI-SAB mixed blocking structure.

More important, the first doped region 430 formed in the fourth doped region 434 and the second doped region 432 formed in the drain region 420D are electrically connected to each other as shown in FIG. 8. Furthermore, the first gate structure 412a of the first gate group 412 is electrically connected to a first power supply pad VDD1, the second gate structure 412b of the first gate group 412 is electrically connected to a second power supply pad VDD2 or a signal input pad IN, and the second gate group 414 (that is the single gate structure 414) is electrically connected to a signal input pad IN or a ground potential GND. The source region 420S and the guard ring 406 are electrically connected to a ground potential GND, and the drain region 420D is electrically connected to an input/output pad I/O. As shown in FIG. 8, when an ESD event occurs, the n-drain region 420D, the p-well region 402 and the n-typed second doped region 432 construct an npn-BJT, and this npn-BJT is self-triggered during the ESD event. Consequently, the ESD current is bypassed from the drain region 420D to the second doped region 432 and then to the first doped region 430, which is electrically connected to the second doped region 432, as arrow "a" depicted. In other words, the preferred embodiment provides at least a self-triggered BJT for bypassing the ESD currents. However, it should be easily realized to those skilled in the art that the electrical relationship between the gate structures, the power supply pads, the signal input pads and the ground pads can be modified according to different requirements and thus it is not limited to this.

Figure 9:
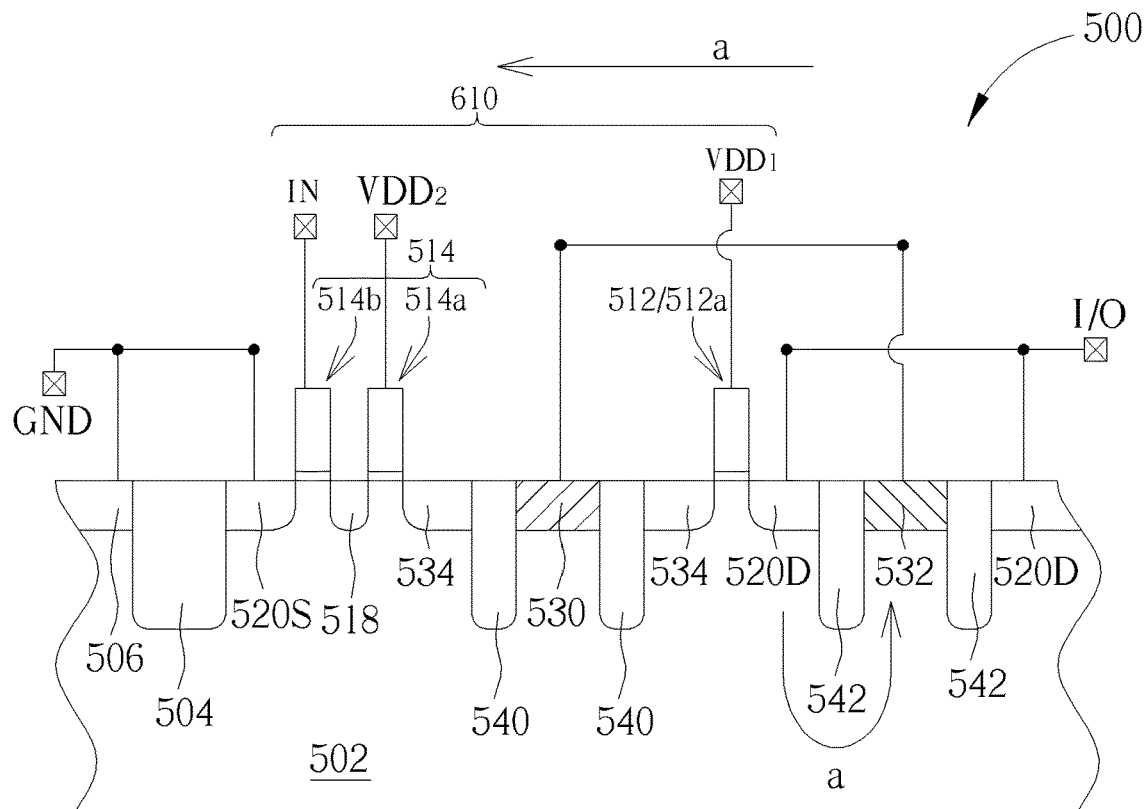
FIG. 9 is a schematic drawing illustrating an ESD protection semiconductor device provided by a fifth preferred embodiment of the present invention.

Please refer to FIG. 9, which is a schematic drawing illustrating an ESD protection semiconductor device provided by a fifth preferred embodiment of the present invention. As shown in FIG. 9, the ESD protection semiconductor device 500 provided by the preferred embodiment includes a substrate, and the substrate includes a well region 502. A gate set 510 is positioned on the substrate and the well region 502. In the preferred embodiment, the ESD protection semiconductor device 500 further includes a source region 520S and a drain region 520D formed in the substrate/the well region 502 respectively at two sides of the gate set 510. At least a second doped region 532 is formed in the drain region 520D. The source region 520S, the drain region 520D and the second doped region 532 include a first conductivity type while the substrate/the well region 502 includes a second conductivity type. The first conductivity type and the second conductivity type are complementary to each other. For example, the first conductivity type is an n type and the second conductivity type is a p type in the preferred embodiment, but not limited to this. In the preferred embodiment, the gate set 510 positioned in between the drain region 520D and the source region 520S further includes a first gate group 512 and a second gate group 514. As shown in FIG. 9, the first gate group 512 and the second gate group 514 are physically spaced apart from each other by a fourth doped region 534. And a first doped region 530 is formed in the fourth doped region 534. In other words, the first gate group 512 is positioned in between the drain region 520D and the fourth doped region 534, and the second gate group 514 is positioned in between the fourth doped region 534 and the source region 520S. The first doped region 530 includes the second conductivity type and the fourth doped region 534 includes the first conductivity type. In the preferred embodiment, the first gate group 512 further includes a single gate structure 512a while the second gate group 514 includes a first gate structure 514a and a second gate structure 514b. A third doped region 518 including the first conductivity type is formed in between the first gate structure 514a and the second gate structure 514b of the second gate group 514 so that the first gate structure 514a and the second gate structure 514b are physically spaced apart from each other by the third doped region 518. However, the first gate structure 514a and the second gate structure 514b are electrically connected to each other by the third doped region 518. Particularly speaking, the first gate structure 514a is positioned in between the fourth doped region 534 and the third doped region 518 while the second gate structure 514b is positioned in between the third doped region 518 and the source region 520S. It is well-known to those skilled in the art that the single gate structure 512a, the first gate structure 514a, and the second gate structure 514b respectively include a gate conductive layer and a gate dielectric layer, and since materials for the gate conductive layer and the gate dielectric layer are well-known to those skilled in the art, those details are omitted in the interest of brevity. Furthermore, the ESD protection semiconductor device 500 includes an isolation structure 504 and a guard ring 506 including the second conductivity type. The isolation structure 504 and the guard ring 506 surround the ESD protection semiconductor device 500 and electrically isolate the ESD protection semiconductor device 500 from other device. In the preferred embodiment, the isolation structure 504 preferably includes a STI structure, but not limited to this.

Please still refer to FIG. 9. In the ESD protection semiconductor device 500 provided by the preferred embodiment, the first doped region 530 is positioned in a center of the fourth doped region 534 and the second doped region 532 is positioned in a center of the drain region 520D, but not limited to this. The modifications to the arrangement of the first doped region 530 and the fourth doped region 534 and to the arrangement of the second doped region 532 and the drain region 520D are exemplarily shown in FIGS. 3-4 as and have been described in the aforementioned modifications therefore those details are omitted for simplicity. It is noteworthy that though the first doped region 530 is formed in the fourth doped region 534, the first doped region 530 is spaced apart from the fourth doped region 534 by a first blocking structure 540. In the same concept, though the second doped region 532 is formed in the drain region 520D, the second doped region 532 is spaced apart from the drain region 520D by a second blocking structure 542. In the preferred embodiment, the first blocking structure 540 and the second blocking structure 542 respectively include a STI structure. However, the first blocking structure 540 and second blocking structure 542 can include dummy gate, SAB, STI-dummy mixed blocking structure, or STI-SAB mixed blocking structure.

More important, the first doped region 530 formed in the fourth doped region 534 and the second doped region 532 formed in the drain region 520D are electrically connected to each other as shown in FIG. 9. Furthermore, the first gate group 512 (that is the single gate structure 512a) is electrically connected to a first power supply pad VDD1, the first gate structure 514a of the second gate group 514 is electrically connected to a second power supply pad VDD2, and the second gate structure 514b of the second gate group 514 is electrically connected to a signal input pad IN. The source region 520S and the guard ring 506 are electrically connected to a ground potential GND, and the drain region 520D is electrically connected to an input/output pad I/O. As shown in FIG. 9, when an ESD event occurs, the n-drain region 520D, the p-well region 502 and the n-typed second doped region 532 construct an npn-BJT, and this npn-BJT is self-triggered during the ESD event. Consequently, the ESD current is bypassed from the drain region 520D to the second doped region 532 and then to the first doped region 530, which is electrically connected to the second doped region 532, as arrow "a" depicted. In other words, the preferred embodiment provides at least a self-triggered BJT for bypassing the ESD currents. However, it should be easily realized to those skilled in the art that the electrical relationship between the gate structures, the power supply pads, the signal input pads and the ground pads can be modified according to different requirements and thus it is not limited to this.

Accordingly, the ESD protection semiconductor devices 400/500 provided by the fourth and fifth preferred embodiments are a multi-gate transistor including self-triggered BJT(s), and its gate structures can be grouped according to different product requirements. Consequently, the ESD currents can be bypassed by the self-triggered BJT(s) and thus the threshold voltage of the ESD protection semiconductor devices 400/500 is efficaciously reduced and the turn-on speed is improved. Since the self-triggered diode serves as the bypass for ESD, damage caused by ESD event is avoided and thus device robustness of the ESD protection semiconductor device 400/500 is improved. More important, since the bypass is a self-triggered structure, no leakage is found when the ESD protection semiconductor device 400/500 is turned off. Additionally, according to the preferred embodiment, formation of the first doped region 430/530 and the second doped region 432/532 can be integrated in the state-of-the-art semiconductor manufacturing process without increasing process complexity and cost.

Figure 10:
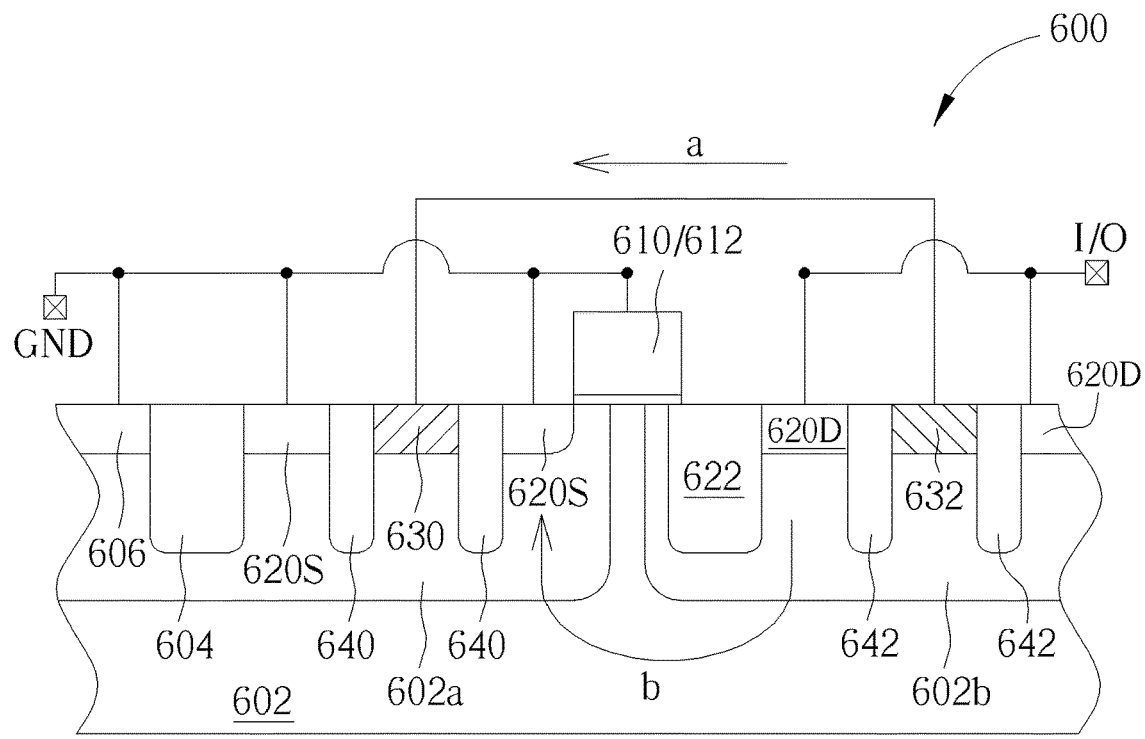
FIG. 10 is a schematic drawing illustrating an ESD protection semiconductor device provided by a sixth preferred embodiment of the present invention.

Please refer to FIG. 10, which is a schematic drawing illustrating an ESD protection semiconductor device provided by a sixth preferred embodiment of the present invention. As shown in FIG. 10, the ESD protection semiconductor device 600 provided by the preferred embodiment includes a p-typed substrate 602, and the substrate 602 includes a first well region 602a and a second well region 602b. The first well region 602a and the second well region 602b are spaced apart from each other by the substrate 602. The first well region 602a and the substrate 602 include a second conductivity type, and the second well region 602b includes a first conductivity type. And the first conductivity type and the second conductivity type are complementary to each other. In the preferred embodiment, the first conductivity type is an n type and the second conductivity type is a p type, but not limited to this. However, as mentioned above, it should be easily realized to those skilled in the art that the first conductivity type can be the p type and the second conductivity type can be the n type. A gate set 610 is positioned on the substrate 602. In the preferred embodiment, the gate set 610 includes a single gate structure 612. As shown in FIG. 10, the single gate structure 612 is positioned in between the first well region 602a and the second well region 602b. Furthermore, the single gate structure 612 overlaps a portion of the first well region 602a and a portion of the second gate structure 602b, respectively. It is well-known to those skilled in the art that the single gate structure 612 includes a gate conductive layer and a gate dielectric layer, and since materials for the gate conductive layer and the gate dielectric layer are well-known to those skilled in the art, those details are omitted in the interest of brevity. Additionally, the ESD protection semiconductor device 600 further includes an isolation structure 622 formed in the second well region 602b, and the gate set 610 (that is the single gate structure 612) covers at least a portion of the isolation structure 622. According to the preferred embodiment, the ESD protection semiconductor device 600 further includes a source region 620S and a drain region 620D formed in the substrate 602 respectively at two sides of the gate set 610. Particularly, the source region 620S is positioned in the first well region 602a and the drain region 620D is positioned in the second well region 602b. The source region 620S and the drain region 620D include the first conductivity type. Furthermore, the ESD protection semiconductor device 600 includes an isolation structure 604 and a guard ring 606 including the second conductivity type. The isolation structure 604 and the guard ring 606 surround the ESD protection semiconductor device 600 and electrically isolate the ESD protection semiconductor device 600 from other device. In the preferred embodiment, the isolation structure 604 preferably includes a STI structure, but not limited to this.

Please still refer to FIG. 10. The ESD protection semiconductor device 600 provided by the preferred embodiment further includes at least a first doped region 630 formed in the source region 620S and at least a second doped region 632 formed in the drain region 620D. Since the source region 620S is formed in the first well region 602a and the drain region 620D is formed in the second well region 602b, it is taken that the first doped region 630 is also formed in the first well region 602a and the second doped region 632 is also formed in the second well region 602b. As shown in FIG. 10, the first doped region 630 is positioned in a center of the source region 620S and the second doped region 632 is positioned in a center of the drain region 620D, but not limited to this. The modifications to the arrangement of the first doped region 630 and the source region 620S and to the arrangement of the second doped region 632 and the drain region 620D are exemplarily shown in FIGS. 3-4 and have been described in the aforementioned modifications therefore those details are omitted for simplicity. It is noteworthy that though the first doped region 630 is formed in the source region 620S, the first doped region 630 is spaced apart from the source region 620S by a first blocking structure 640. In the same concept, though the second doped region 632 is formed in the drain region 620D, the second doped region 632 is spaced apart from the drain region 620D by a second blocking structure 642. As shown in FIG. 10, the first blocking structure 640 surrounds the first doped region 630 and therefore isolates the first doped region 630 from the source region 620S. Also, the second blocking structure 642 surrounds the second doped region 632 and therefore isolates the second doped region 632 from the drain region 620D. In the preferred embodiment, the first blocking structure 640 and the second blocking structure 642 respectively include a STI structure. However, the first blocking structure 640 and the second blocking structure 462 can include dummy gate, SAB, STI-dummy gate mixed blocking structure, or STI-SAB mixed blocking structure. Furthermore, the first doped region 630 includes the second conductivity type while the second doped region 632 includes the first conductivity type.

More important, the first doped region 630 formed in the source region 620S and the second doped region 632 formed in the drain region 620D are electrically connected to each other as shown in FIG. 10. Furthermore, the gate set 610 (that is the single gate structure 612), the source region 620S and the guard ring 606 are electrically connected to a ground potential GND, and the drain region 620D is electrically connected to an input/output pad I/O. As shown in FIG. 10, when an ESD event occurs, the ESD surges will be diverted to the ground by the gate set 610 (that is the single gate structure 612) which is electrically connected to the ground potential GND. More important, the n-drain region 620D, the n-typed second well region 602b, the p-typed substrate 602, the p-typed first well region 602a, and the n-typed source region 602S construct an npn-BJT and this npn-BJT is self-triggered during the ESD event. Consequently, the ESD current is bypassed from the drain region 620D to the source region 460S, which is electrically connected to the ground pad GND, as arrow "b" depicted. Briefly speaking, the preferred embodiment provides at least a self-triggered BJT for bypassing the ESD currents.

Accordingly, the ESD protection semiconductor device 600 provided by the preferred embodiment is a LDMOS transistor including a self-triggered structure. Consequently, the ESD currents can be bypassed by the self-triggered diode, and thus the threshold voltage of the ESD protection semiconductor device 600 is efficaciously reduced and the turn-on speed is improved. Since the self-triggered diode serves as the bypass for ESD, damage caused by ESD event is avoided and thus device robustness of the ESD protection semiconductor device 600 is improved. More important, since the bypass is a self-triggered structure, no leakage is found when the ESD protection semiconductor device 600 is turned off. Additionally, according to the preferred embodiment, formation of the first doped region 630 and the second doped region 632 can be integrated in the state-of-the-art semiconductor manufacturing process without increasing process complexity and cost.

Figure 11:
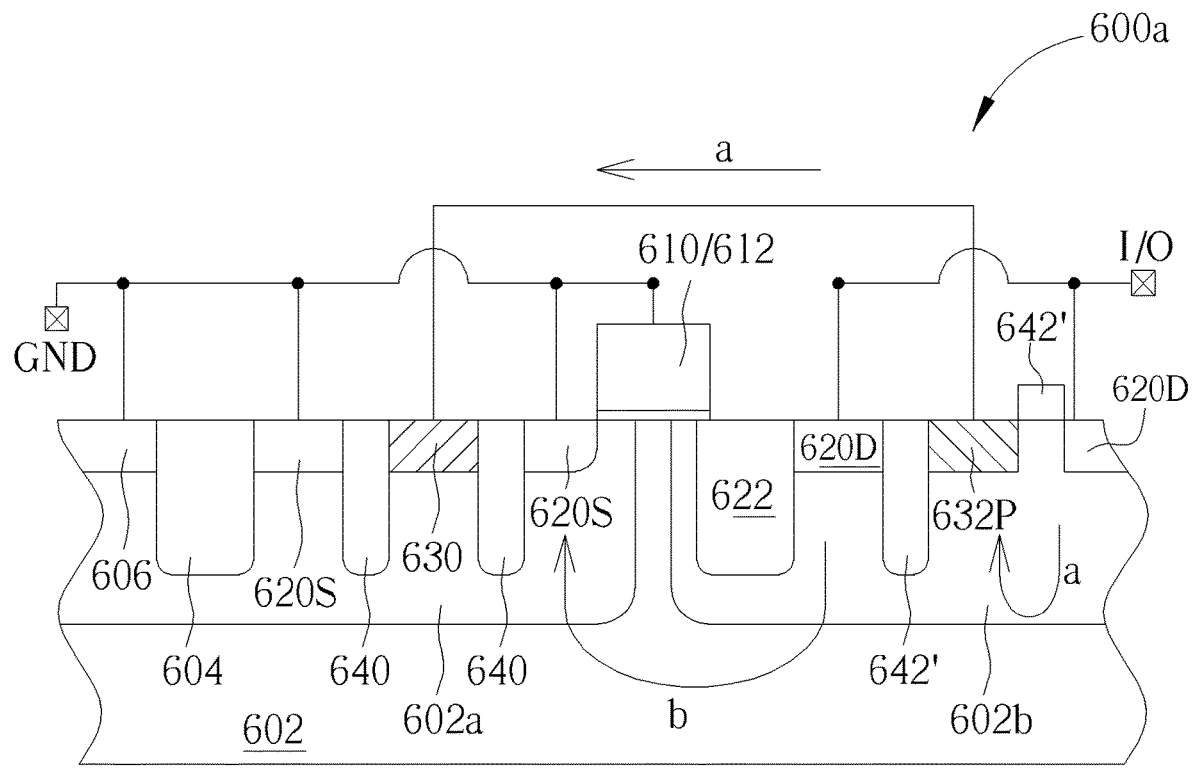
FIG. 11 is a schematic drawing illustrating an ESD protection semiconductor device provided by a modification to the sixth preferred embodiment.

Please refer to FIG. 11, which is a schematic drawing illustrating an ESD protection semiconductor device provided by a modification to the sixth preferred embodiment. It should be noted that elements the same in the present modification and the sixth preferred embodiment are designated by the same numerals and include the same material choice and electrical relationships, therefore those details are omitted for simplicity. The difference between the modification and the preferred embodiments is detailed: According to the ESD protection semiconductor device 600a provided by the modification, the second blocking structure includes a mixed type blocking structure 642'. Specifically, the mixed type blocking structure 642' can include a STI-dummy gate mixed blocking structure or a STI-SAB mixed blocking structure. It should be noted that in the modification, the mixed type blocking structure 642' preferably includes the STI at the side near the gate set 610 such that electrical isolation is ensured. More important, the second doped region 632 which includes the first conductivity type in the abovementioned preferred embodiments is replaced with a second doped region 632p including the second conductivity type.

Accordingly, when an ESD event occurs, the ESD surges will be diverted to the ground by the second gate structure 610, which is electrically connected to the ground potential GND. More important, the n-drain region 620D, the n-typed second well region 602b, and the p-typed second doped region 632p construct a diode, and this diode is self-triggered during the ESD event. Consequently, the ESD current is bypassed from the drain region 620D to the second doped region 632p and then to the first doped region 630, which is electrically connected to the second doped region 632p, as arrows "a" depicted. As mentioned above, the n-drain region 620D, the n-typed second well region 602b, the p-substrate 602, the p-typed first well region 602a, and the n-source region 620S construct an npn-BJT. This npn-BJT is also self-triggered during the ESD events, and thus the ESD current is bypassed from the drain region 620D to the source region 620S, which is electrically connected to the ground potential GND, as arrow "b" depicted. Briefly speaking, the preferred embodiment provides the self-triggered structures (including the diode and the BJT) for bypassing the ESD currents.

Figure 12:
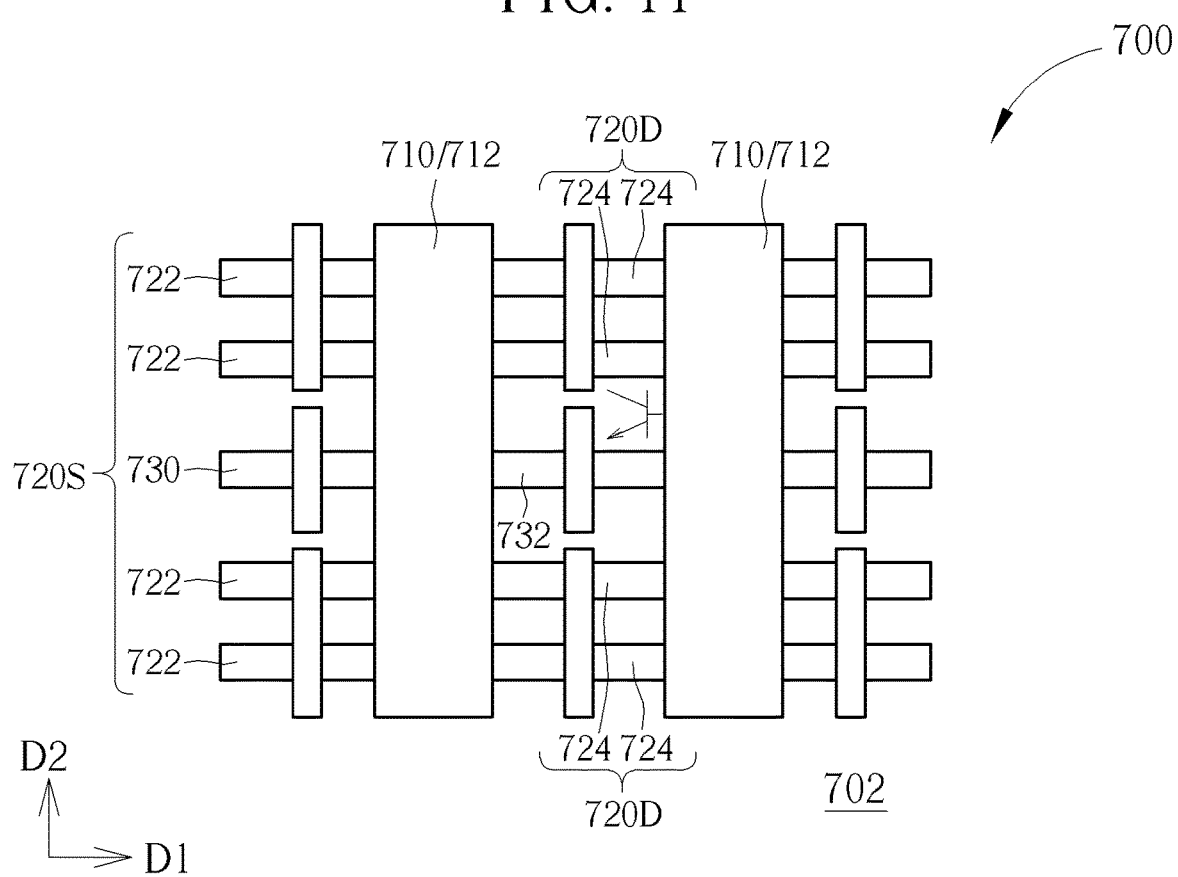
FIG. 12 is a schematic drawing illustrating an ESD protection semiconductor device provided by a seventh preferred embodiment of the present invention.

Please refer to FIG. 12, which is a schematic drawing illustrating an ESD protection semiconductor device provided by a seventh preferred embodiment of the present invention. As shown in FIG. 12, the ESD protection semiconductor device 700 provided by the preferred embodiment includes a substrate 702, and a gate set 710 is positioned on the substrate 702. In the preferred embodiment, the gate set 710 includes a single gate structure 712. It is well-known to those skilled in the art that the single gate structure 712 includes a gate conductive layer and a gate dielectric layer, and since materials for the gate conductive layer and the gate dielectric layer are well-known to those skilled in the art, those details are omitted in the interest of brevity. Additionally, the gate set 710 can include two gate structures, three gate structures, or the gate group(s) as mentioned above. The amount and arrangement of the gate set 710 can be modified as mentioned above, and thus details are all omitted for simplicity. As shown in FIG. 12, the ESD protection semiconductor device 700 further includes a source region 720S and a drain region 720D formed in the substrate 702 respectively at two sides of the gate set 710. It is noteworthy that according to the preferred embodiment, the source region 720S includes a plurality of source fins 722 and the drain region 720D includes a plurality of drain fins 724. As shown in FIG. 12, the source fins 722 are parallel with each other, and the drain fins 724 are parallel with each other. In the preferred embodiment, the source fins 722 and the drain fins 724 can be formed on the substrate 702 by performing multiple patterning process, such as, for example but not limited to, double patterning process. The source fins 722 and the drain fins 724 are extended along a first direction D1, and arranged along a second direction D2. The first direction D1 is perpendicular to the second direction D2. The gate set 710 is extended along the second direction D2. Furthermore, the gate set 710 covers a portion of the fins.

Please still refer to FIG. 12. At least a first doped fin 730 is formed in the source region 720S, and at least a second doped fin 732 is formed in the drain region 720D. As shown in FIG. 12, the first doped fin 730 is parallel with the source fins 722 and physically spaced apart from the source fins 722. In the same concept, the second doped fin 732 is parallel with the drain fins 724 and physically spaced apart from the drain fins 724. The source region 720S (including all of the source fins 722), the drain region 720D (including all of the drain fins 724) and the second doped fin 732 include a first conductivity type while the first doped fin 730 and the substrate 702 include a second conductivity type, and the first conductivity type and the second conductivity type are complementary to each other. For example, the first conductivity type is an n type and the second conductivity type is a p type in the preferred embodiment.

More important, the first doped fin 730 formed in the source region 720S and the second doped fin 732 formed in the drain region 720D are electrically connected to each other as shown in FIG. 12. Furthermore, the gate set 710 (that is the single gate structure 712) and the source region 720S are electrically connected to a ground potential (not shown), and the drain region 720D is electrically connected to an I/O pad (not shown). As shown in FIG. 12, when an ESD event occurs, the ESD surges will be diverted to the ground by the gate set 710/712, which is electrically connected to the ground potential. More important, the n-drain region 720D, the p-substrate 702 and the n-typed second doped fin 732 construct an npn-BJT, and this npn-BJT is self-triggered during the ESD event. Consequently, the ESD current is bypassed from the drain region 720D to the second doped fin 732 and then to the first doped fin 730, which is electrically connected to the second doped fin 732. Moreover, the n-drain region 720D, the p-substrate 702 and the n-source region 720S construct another npn-BJT. This npn-BJT is also self-triggered during the ESD events, and thus the ESD current is bypassed from the drain region 720D to the source region 720S, which is electrically connected to the ground potential. Briefly speaking, the preferred embodiment provides plural self-triggered BJTs for bypassing the ESD currents.

Figure 13:
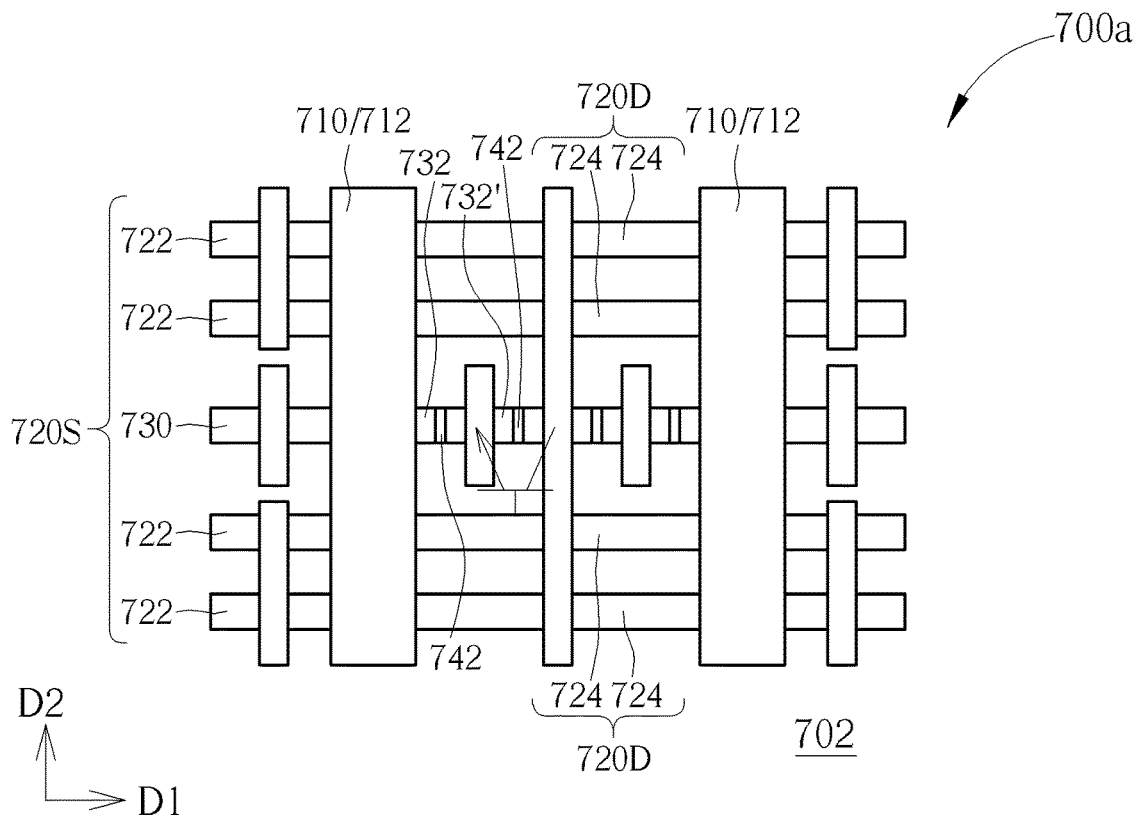
FIG. 13 and FIG. 14 are schematic drawings illustrating an ESD protection semiconductor device provided by a modification to the seventh preferred embodiment.
Figure 14:
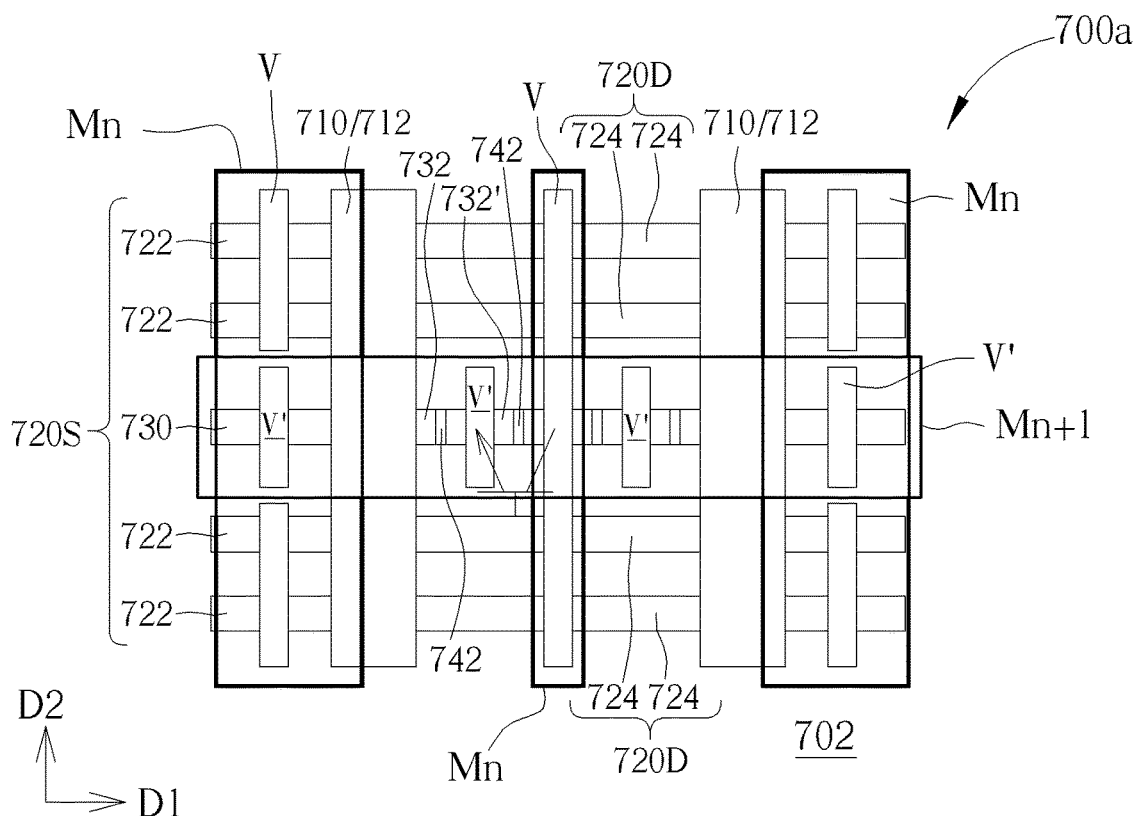

Please refer to FIG. 13 and FIG. 14, which are schematic drawings illustrating an ESD protection semiconductor device provided by a modification to the seventh preferred embodiment. It should be noted that elements the same in the present modification and the seventh preferred embodiment are designated by the same numerals and include the same material choice and electrical relationships, therefore those details are omitted for simplicity. The difference between the modification and the preferred embodiments is detailed: The ESD protection semiconductor device 700a of the present modification further includes a plurality of isolation structures 742 formed in the second doped fin 732. Consequently, a single doped region 732' is formed in the second doped fin 732. As shown in FIG. 13, the second doped fin 732 can be electrically connected to the drain fins 724, but the single doped region 732' is electrically isolated from the second doped fin 732 by the isolation structures 742.

Please refer to FIG. 14. According to the present modification, metal layers Mn and contact plugs V are provided to build the electrical connections for the source fins 722 and for the drain fins 724, respectively. Furthermore, by another metal layers (Mn+1) and contact plugs V', the single doped region 732' is electrically connected to the first doped fin 730. When an ESD event occurs, the ESD surges will be diverted to the ground by the gate set 710/712, which is electrically connected to the ground potential GND. More important, the n-drain region 720D, the n-typed second doped fin 732, the p-substrate 702, and the n-typed single doped region 732' construct an npn-BJT, and this npn-BJT is self-triggered during the ESD event. Consequently, the ESD current is bypassed from the drain region 720D to the single doped region 732', and then to the first doped fin 730, which is electrically connected to the single doped region 732'. Moreover, the n-drain region 720D, the p-substrate 702 and the n-source region 720S also construct an npn-BJT. This npn-BJT is also self-triggered during the ESD events, and thus the ESD current is bypassed from the drain region 720D to the source region 720S, which is electrically connected to the ground potential. Briefly speaking, the preferred embodiment provides plural self-triggered BJTs for bypassing the ESD currents.

Please refer to FIG. 12 and FIG. 13 again. According to the seventh preferred embodiment and its modification, it is found though the emitter of the BJT, the collector of the BJT and the current direction are different, BJTs are still successfully formed and thus bypasses for ESD currents are still obtained.

Figure 15:
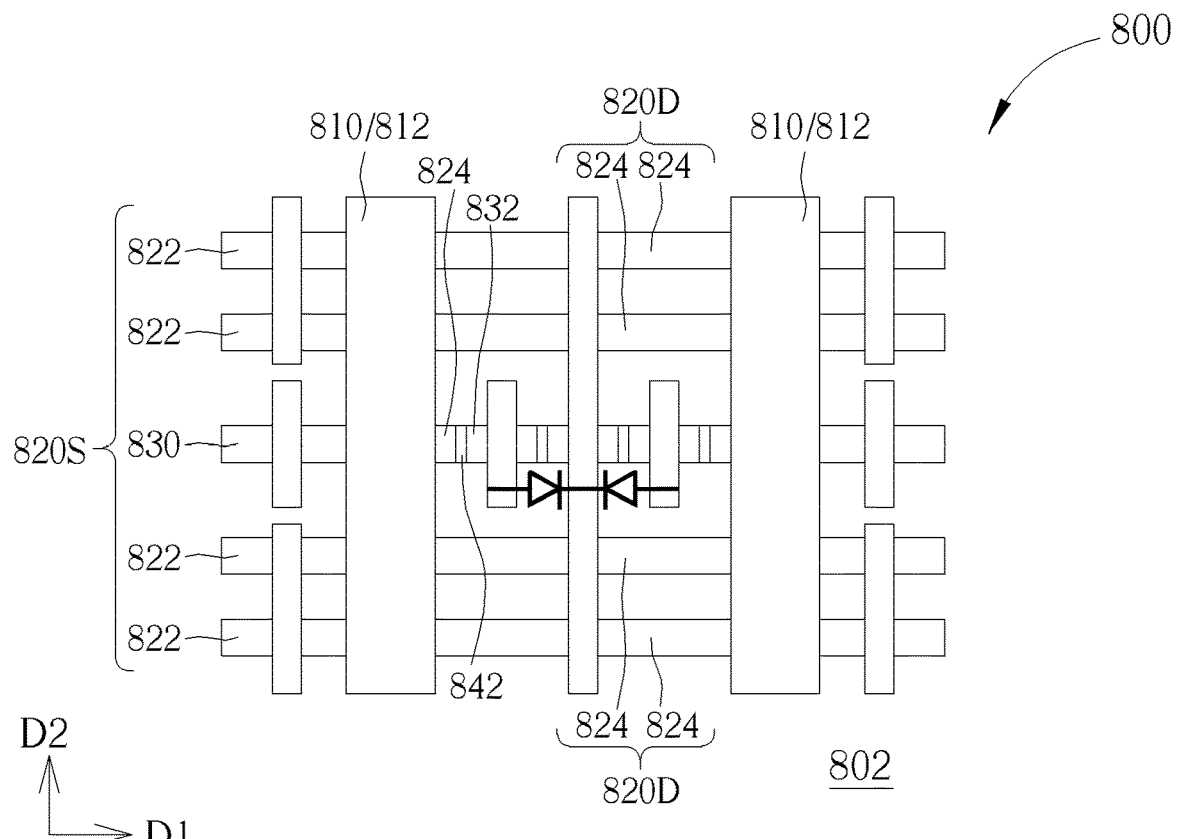
FIG. 15 is a schematic drawing illustrating an ESD protection semiconductor device provided by an eighth preferred embodiment of the present invention.
Figure 16:
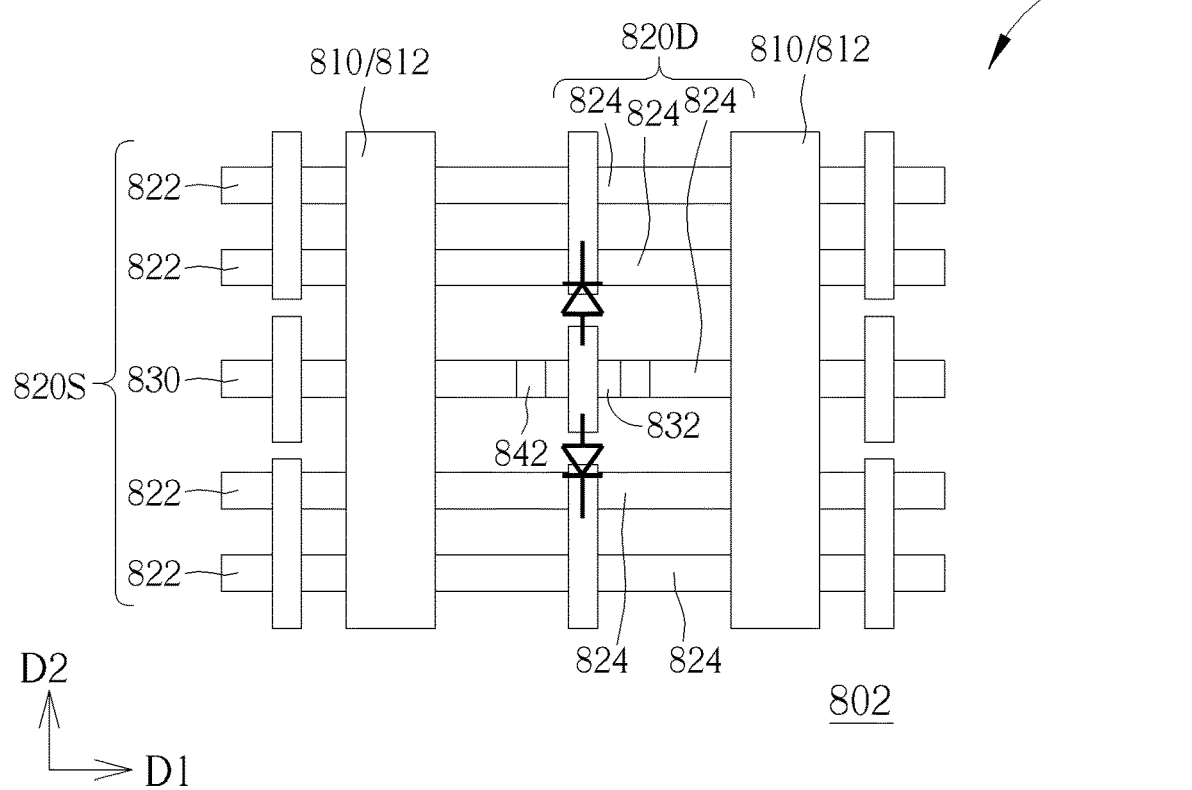
FIG. 16 is a schematic drawing illustrating an ESD protection semiconductor device provided by a modification to the eighth preferred embodiment.

Please refer to FIG. 15 and FIG. 16, wherein FIG. 15 is a schematic drawing illustrating an ESD protection semiconductor device provided by an eighth preferred embodiment of the present invention, and FIG. 16 is a schematic drawing illustrating an ESD protection semiconductor device provided by a modification to the eighth preferred embodiment. It should be noted that elements the same in the present modification and the eighth preferred embodiment are designated by the same numerals and include the same material choice and electrical relationships, therefore those details are omitted for simplicity. As shown in FIG. 15 and FIG. 16, the ESD protection semiconductor device 800/800a provided by the preferred embodiment and its modification includes a substrate 802, and a gate set 810 is positioned on the substrate 802. In the preferred embodiment, the gate set 810 includes a single gate structure 812. It is well-known to those skilled in the art that the single gate structure 812 includes a gate conductive layer and a gate dielectric layer, and since materials for the gate conductive layer and the gate dielectric layer are well-known to those skilled in the art, those details are omitted in the interest of brevity. Additionally, the gate set 810 can include two gate structures, three gate structures, or the gate group(s) as mentioned above. The amount and arrangement of the gate set 810 can be modified as mentioned above, and thus details are all omitted for simplicity. As shown in FIG. 15 and FIG. 16, the ESD protection semiconductor device 800/800a further includes a source region 820S and a drain region 820D formed on the substrate 802 respectively at two sides of the gate set 810. It is noteworthy that according to the preferred embodiment, the source region 820S includes a plurality of source fins 822 and the drain region 820D includes a plurality of drain fins 824. In other words, the ESD protection semiconductor device 800/800*a* provided by the eighth preferred embodiment and its modification includes a plurality of source fins 822 and a plurality of drain fins 824 formed on the substrate 802 respectively at two opposite sides of the gate set 810. As shown in FIG. 15, the source fins 822 are parallel with each other and the drain fins 824 are parallel with each other. As mentioned above, the source fins 822 and the drain fins 824 can be formed on the substrate 802 by performing multiple patterning process, such as, for example but not limited to, double patterning process. The source fins 822 and the drain fins 824 are extended along a first direction D1, and arranged along a second direction D2. The first direction D1 is perpendicular to the second direction D2. The gate set 810 is extended along the second direction D2. Furthermore, the gate set 810 covers a portion of the fins.

Please still refer to FIG. 15 and FIG. 16. At least a first doped fin 830 is formed in the source region 820S, and at least a second doped fin 832 is formed in the drain region 820D. As shown in FIG. 15, the first doped fin 830 is parallel with the source fins 822 and physically spaced apart from the source fins 822. In the same concept, the second doped fin 832 is parallel with the drain fins 824 and physically spaced apart from the drain fins 824. The source region 820S (including all of the source fins 822) and the drain region 820D (including all of the drain fins 824) include a first conductivity type while the first doped fin 830, the second doped fin 832 and the substrate 802 include a second conductivity type, and the first conductivity type and the second conductivity type are complementary to each other. For example, the first conductivity type is an n type and the second conductivity type is a p type in the preferred embodiment, but not limited to this. The first doped fin 830 and the second doped fin 832 are electrically connected to each other. More important, the ESD protection semiconductor device 800/800*a* further includes a plurality of isolation structures 842 formed in the drain fins 824. Consequently, the second doped fin 832 is physically and electrically isolated from the drain fins 824 by the isolation structures 842.

In the preferred embodiment, the gate set 810 (that is the single gate structure 812) and the source region 820S are electrically connected to a ground potential (not shown), and the drain region 820D is electrically connected to an I/O pad (not shown). As shown in FIG. 15, when an ESD event occurs, the ESD surges will be diverted to the ground by the gate set 810/812, which is electrically connected to the ground potential. More important, the n-drain fins 824, the p-substrate 802 and the p-typed second doped fin 832 construct a diode, and this diode is self-triggered during the ESD event. Consequently, the ESD current is bypassed from the drain region 820D to the second doped fin 832 and then to the first doped fin 830, which is electrically connected to the second doped fin 832. Moreover, the n-drain region 820D, the p-substrate 802 and the n-source region 820S construct another npn-BJT. This npn-BJT is also self-triggered during the ESD events, and thus the ESD current is bypassed from the drain region 820D to the source region 820S, which is electrically connected to the ground potential. Briefly speaking, the preferred embodiment provides the self-triggered structures (including the diode and the BJT) for bypassing the ESD currents.

Please refer to FIG. 15 and FIG. 16 again. The difference between the preferred embodiment and its modification is detailed: As shown in FIG. 15, in the eighth preferred embodiment, the current direction of the diode is parallel with the extending direction of the drain fins 824. Different from the eighth preferred embodiment, the current direction of the diode is perpendicular to the extending direction of the drain fins 824 according to the modification, as shown in FIG. 16. However, though the current directions are different between the eighth preferred embodiment and its modification, the self-triggered diodes are always formed for bypassing the ESD currents, and thus the threshold voltage of the ESD protection semiconductor device 800/800*a* is efficaciously reduced and the turn-on speed is improved. Since the self-triggered structures serve as the bypass for ESD, damage caused by the ESD event is avoided and thus device robustness of the ESD protection semiconductor device 800/800*a* is improved. More important, since the bypasses are self-triggered structures, no leakage is found when the ESD protection semiconductor device 800/800*a* is turned off. Additionally, according to the preferred embodiment, formation of the first doped fin 830 and the second doped fin 832 can be integrated in the state-of-the-art semiconductor manufacturing process without increasing process complexity and cost.

According to the ESD protection semiconductor device provided by the present invention, the second doped region/second doped fin formed in the drain region/drain fins construct a self-triggered BJT or diode, therefore the threshold voltage of the ESD protection semiconductor device is reduced while the turn-on speed and the device robustness of the ESD protection semiconductor device are improved. Furthermore, the ESD protection semiconductor device provided by the present invention includes the gate set, and the gate set can include the single gate, the multi gate, or the multi gate group. Therefore, the ESD protection semiconductor device provided by the present invention is able to be integrated into single-gate MOS transistor device, cascode transistor device, multi-gate MOS transistor. Additionally, by forming well regions of different conductivity types in the substrate, the ESD protection semiconductor device provided by the present invention is able to be integrated with LDMOS transistor approach. Furthermore, the ESD protection semiconductor device provided by the present invention is able to be integrated into FinFET approaches. In other words, the ESD protection semiconductor device provided by the present invention is able to be integrated with various transistor approaches, thus product flexibility and functionality of the ESD protection semiconductor device are both improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An ESD protection semiconductor device, comprising:
   a substrate;
   a gate set disposed on the substrate;
   a plurality of source fins and a plurality of drain fins disposed in the substrate respectively at two sides of the gate set, wherein the source fins and the drain fins comprise a first conductivity type;
   a first doped fin disposed in the substrate at one side of the gate set the same as the source fins, wherein the first doped fin is positioned in between the source fins and spaced apart from the source fins, wherein the first doped fin comprises a second conductivity type, and the first conductivity type and the second conductivity type are complementary to each other; and a second doped fin formed in one of the drain fins and isolated from the one of the drain fins by an isolation structure, wherein the second doped fin is electrically connected to the first doped fin;

wherein the substrate comprises the second conductivity type;

wherein the second doped fin comprises the second conductivity type;

wherein the drain fins, the substrate under the isolation structure and the single doped region construct a diode having a current direction parallel with the drain fins.

2. ESD protection semiconductor device according to claim 1, wherein the source fins are electrically connected to a ground pad, and the drain fins are electrically connected to an IO pad.

3. The ESD protection semiconductor device according to claim 1, wherein the source fins and the drain fins extend along a first direction and are arranged in parallel along a second direction, wherein the first direction and the second direction are perpendicular.

4. The ESD protection semiconductor device according to claim 3, wherein the first doped fin and the second doped fin extend along the first direction.

5. The ESD protection semiconductor device according to claim 3, further comprising at least a contact plug disposed on the substrate, extending along the second direction and overlapping on the drain fins to electrically connect to the drain fins.

6. The ESD protection semiconductor device according to claim 5, wherein the contact plug overlaps the one of the drain fins having the second doped fin on a region that is isolated from the second doped fin.

7. The ESD protection semiconductor device according to claim 3, further comprising at least a contact plug disposed on the substrate, extended along the second direction and overlapping on the source fins to electrically connect to the source fins.

8. The ESD protection semiconductor device according to claim 7, wherein the contact plug connected to the source fins does not overlap the first doped fin.

9. The ESD protection semiconductor device according to claim 1, further comprising another isolation structure formed in the substrate to electrically isolate the plurality of source fins and the plurality of drain fins, wherein the isolation structure and the another isolation structure collectively surround the second doped fin.

* * * * *